US012727146B2

(12) United States Patent
Kim et al.

(10) Patent No.: US 12,727,146 B2
(45) Date of Patent: Sep. 1, 2026

(54) SEMICONDUCTOR MEMORY DEVICE

(71) Applicant: Samsung Electronics Co., Ltd., Suwon-si (KR)

(72) Inventors: Changsik Kim, Suwon-si (KR); Jae Won Na, Suwon-si (KR); Junhwa Song, Suwon-si (KR); Dong-Sik Park, Suwon-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 475 days.

(21) Appl. No.: 18/339,861

(22) Filed: Jun. 22, 2023

(65) Prior Publication Data

US 2024/0155829 A1 May 9, 2024

(30) Foreign Application Priority Data

Nov. 4, 2022 (KR) ........................ 10-2022-0146175

(51) Int. Cl.

*H10B 12/00* (2023.01)
*H10B 80/00* (2026.01)
*H10W 90/00* (2026.01)

(52) U.S. Cl.

CPC ........... *H10B 12/315* (2023.02); *H10B 12/50* (2023.02); *H10B 80/00* (2023.02); *H10W 90/00* (2026.01); *H10W 90/792* (2026.01)

(58) Field of Classification Search

CPC ...... H10B 12/488; H10B 12/30; H10B 61/22; H10B 63/34; H10B 12/482; H10B 12/315; H10B 12/34; H10B 12/377; H10B 12/395; H10B 12/0383; H10B 12/033; H10B 12/038; H10B 12/36; G11C 8/14; G11C 11/4097; H01L 25/0657; H01L 25/18; H01L 2924/1431; H01L 2924/1436

See application file for complete search history.

(56) References Cited

U.S. PATENT DOCUMENTS

| | | | | |
|---|---|---|---|---|
| 6,097,621 | A | 8/2000 | Mori | |
| 10,622,030 | B1 | 4/2020 | Wang et al. | |
| 2007/0284623 | A1* | 12/2007 | Kim | H10D 89/10 257/E21.655 |
| 2009/0121268 | A1 | 5/2009 | Lee et al. | |
| 2009/0236656 | A1 | 9/2009 | Sung et al. | |

(Continued)

FOREIGN PATENT DOCUMENTS

| | | | |
|---|---|---|---|
| CN | 112838085 | A | 5/2021 |
| KR | 2004/0081984 | A | 9/2004 |

(Continued)

*Primary Examiner* — Julio J Maldonado
*Assistant Examiner* — Paul A Berry
(74) *Attorney, Agent, or Firm* — Harness, Dickey & Pierce, P.L.C.

(57) ABSTRACT

A semiconductor memory device may include a plurality of bit lines extending in a first direction on a substrate, a plurality of active pillars respectively on the bit lines, a word line extending in a second direction along the plurality of active pillars, a plurality of landing pads respectively on the plurality of active pillars, and a plurality of data storage patterns respectively on the plurality of landing pads. Each of the plurality of active pillars may have a length extending in a direction perpendicular to an upper surface of the substrate. The word line has a wavy shape when viewed in a plan view.

15 Claims, 26 Drawing Sheets

(56) References Cited

U.S. PATENT DOCUMENTS

| | | | | |
|---|---|---|---|---|
| 2011/0111568 | A1 | 5/2011 | Kim et al. | |
| 2013/0056812 | A1 | 3/2013 | Kim et al. | |
| 2014/0021485 | A1 | 1/2014 | Cho | |
| 2014/0252458 | A1 | 9/2014 | Sung et al. | |
| 2016/0064407 | A1 | 3/2016 | Kim et al. | |
| 2017/0098651 | A1* | 4/2017 | Zhang | G11C 11/56 |
| 2020/0135241 | A1* | 4/2020 | Wang | G11C 5/063 |
| 2022/0085023 | A1 | 3/2022 | Shin et al. | |

FOREIGN PATENT DOCUMENTS

| | | | |
|---|---|---|---|
| KR | 100919369 | B1 | 9/2009 |
| KR | 100985412 | B1 | 10/2010 |
| KR | 2013/0027155 | A | 3/2013 |
| KR | 101303180 | B1 | 9/2013 |
| KR | 101607265 | B1 | 3/2016 |
| KR | 101925012 | B1 | 12/2018 |
| KR | 102188501 | B1 | 12/2020 |
| KR | 102190147 | B1 | 12/2020 |
| KR | 102361083 | B1 | 2/2022 |
| KR | 2022/0099142 | A | 7/2022 |

* cited by examiner

B'
BL
BL4
BL3
BL
BL2
BL1
B
DSP
INP
LP
ILD2
GI
ACP
ILD1
LIL
SUB
D3
D2

WL (CRP3)
RCS2
LP
C'
BL
BL4
BL3
BL
BL2
BL1
C
GP
WL(CRP1)
ILD2
GI
ACP
ILD1
LIL
SUB
D2
D3

SEMICONDUCTOR MEMORY DEVICE

CROSS-REFERENCE TO RELATED APPLICATIONS

This U.S. non-provisional patent application claims priority under 35 U.S.C. § 119 to Korean Patent Application No. 10-2022-0146175, filed on Nov. 4, 2022, in the Korean Intellectual Property Office, the entire contents of which are hereby incorporated by reference.

BACKGROUND

Inventive concepts relate to a semiconductor memory device, and more particularly, relate to a semiconductor memory device including vertical channel transistors and/or a method of manufacturing the same.

A manufacturing method has advanced to improve integration of a semiconductor device with a decrease in a design rule of the semiconductor device and to improve operational speed and yield.

SUMMARY

A transistor may include a vertical channel to improve integration, resistance, and current driving capability.

Inventive concepts provide a semiconductor memory device having improved electrical characteristics and integration.

Embodiments of inventive concepts provide a method of manufacturing a semiconductor memory device having improved electrical characteristics and integration.

A semiconductor memory device according to some embodiments of inventive concepts may include a substrate; a plurality of bit lines extending in a first direction on the substrate; a plurality of active pillars respectively on the bit lines, each of the plurality of active pillars having a length extending in a direction perpendicular to an upper surface of the substrate; a word line extending in a second direction along the plurality of active pillars, a plurality of landing pads respectively provided on the plurality of active pillars; and a plurality of data storage patterns respectively on the plurality of landing pads. The word line may have a wavy shape when viewed in a plan view.

A semiconductor memory device according to some embodiments of inventive concepts may include a substrate; a plurality of bit lines extending in a first direction on the substrate; a plurality of active pillars on the plurality of bit lines, each of the plurality of active pillars having a length extending in a direction perpendicular to an upper surface of the substrate; a plurality of word lines extending in a second direction crossing the first direction, each of the plurality of word lines extending along the plurality of active pillars that are arranged in the second direction; a plurality of landing pads respectively on the plurality of active pillars; and a plurality of data storage patterns respectively on the plurality of landing pads. The plurality of bit lines may include a first bit line, a second bit line, a third bit line, and a fourth bit line sequentially arranged in the second direction. The plurality of active pillars may include a first column including first active pillars on the first bit line, a second column including second active pillars on the second bit line, and a third column including third active pillars on the third bit line, and a fourth column including fourth active pillars on the fourth bit line. The first column and the second column may be offset in the first direction. The third column and the fourth column may be offset in the first direction. The first column and the third column may be aligned with each other. The second column and the fourth column may be aligned with each other.

A semiconductor memory device according to some embodiments of inventive concepts may include a peripheral circuit structure including peripheral circuits on a substrate; a plurality of bit lines extending in a first direction on the peripheral circuit structure; a plurality of active pillars on the plurality of bit lines, each of the plurality of active pillars having a length in a direction perpendicular to an upper surface of the substrate; a word line extending in a second direction crossing the first direction; a gate insulating layer on a sidewall of each of the plurality of active pillars, the gate insulating layer being between the active pillar and the word line and extending to a bottom surface of the word line; a gate capping pattern on the word line; a plurality of landing pads respectively on the plurality of active pillars; and a plurality of data storage patterns respectively on the plurality of landing pads. The plurality of active pillars may be arranged in a zigzag shape in the second direction. The word line may extend along the plurality of active pillars that are arranged in the zigzag shape.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

Expressions such as "at least one of," when preceding a list of elements (e.g., A, B, and C), modify the entire list of elements and do not modify the individual elements of the list. For example, "at least one of A, B, and C," "at least one of A, B, or C," "one of A, B, C, or a combination thereof," and "one of A, B, C, and a combination thereof," respectively, may be construed as covering any one of the following combinations: A; B; C; A and B; A and C; B and C; and A, B, and C."

Figure 1:
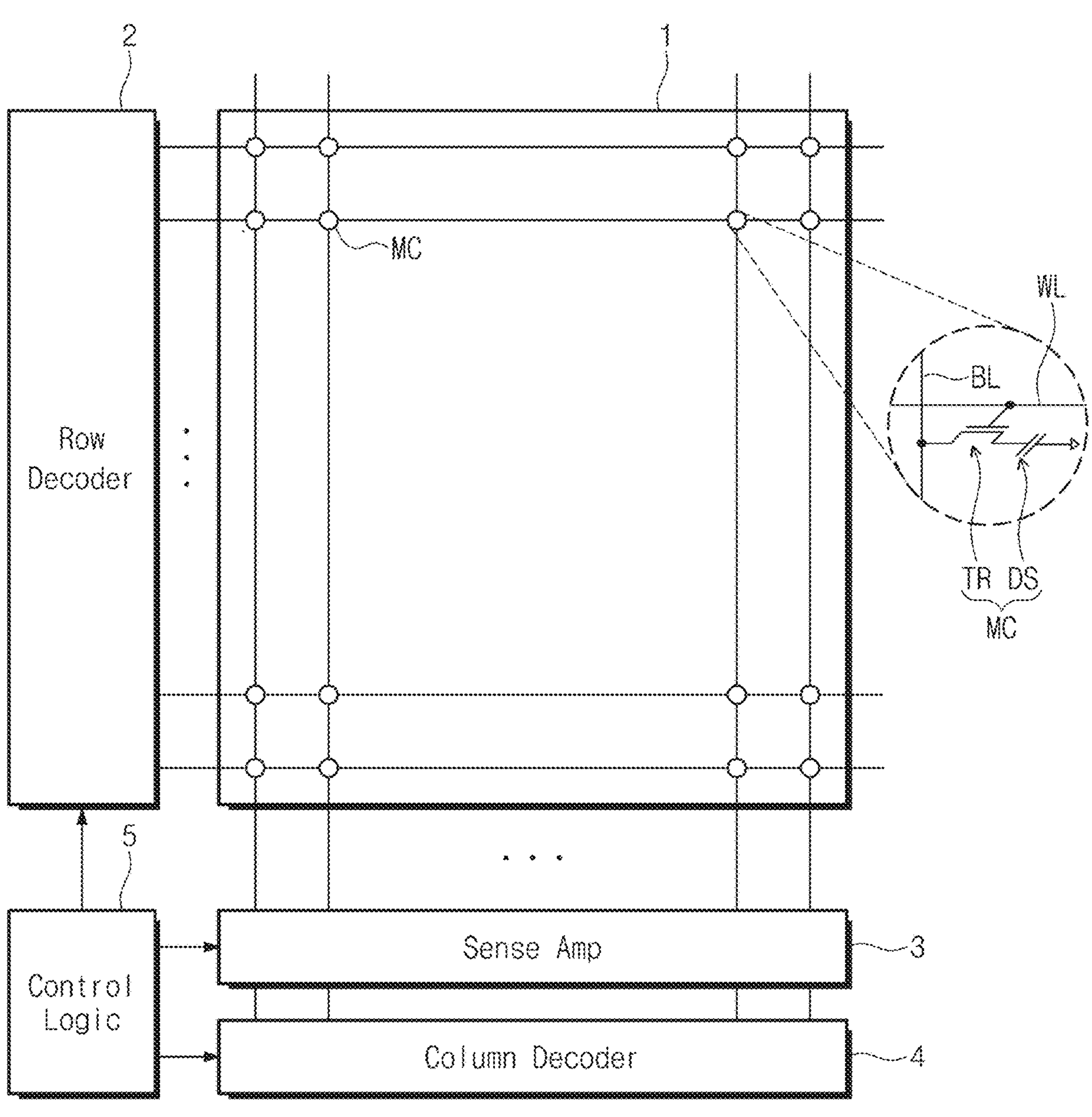
FIG. 1 is a block diagram of a semiconductor memory device according to embodiments of inventive concepts.

FIG. 1 is a block diagram of a semiconductor memory device according to embodiments of inventive concepts. Referring to FIG. 1, a semiconductor memory device may include a memory cell array 1, a row decoder 2, a sense amplifier 3, a column decoder 4, and a control logic 5.

The memory cell array 1 may include a plurality of memory cells MC arranged two-dimensionally or three-dimensionally. Each of the memory cells MC may be connected between a word line WL and a bit line BL that cross each other.

Each of the memory cells MC may include a selection element TR and a data storage element DS. The selection element TR and the data storage element DS may be electrically connected to each other. The selection element TR may be connected to both the word line WL and the bit line BL. That is, the selection element TR may be provided at a point where the word line WL and the bit line BL cross each other.

The selection element TR may include a field effect transistor. The data storage element DS may include a capacitor, a magnetic tunnel junction pattern, or a variable resistor. For example, a gate terminal of a transistor serving as the selection element TR may be connected to the word line WL, and source/drain terminals of the transistor may be connected to the bit line BL and the data storage element DS, respectively.

The row decoder 2 may decode address information, which may be input from outside the semiconductor memory device, and may select one of the word lines WL of the memory cell array 1. The address information decoded by the row decoder 2 may be provided to a row driver (not shown), and the row driver may provide specific voltages to a selected word line WL and unselected word lines WL, respectively, in response to a control of control circuits.

The sense amplifier 3 may sense, amplify, and output a difference in voltage between one of the bit lines BL, which is selected based on address information decoded by the column decoder 4, and a reference bit line.

The column decoder 4 may provide a data transmission path between the sense amplifier 3 and an external device (e.g., a memory controller). The column decoder 4 may decode address information, which is input from outside the semiconductor memory device, and may select one of the bit lines BL, based on the decoded address information.

The control logic 5 may generate control signals, which are used to control data writing or reading operations on the memory cell array 1.

Figure 2:
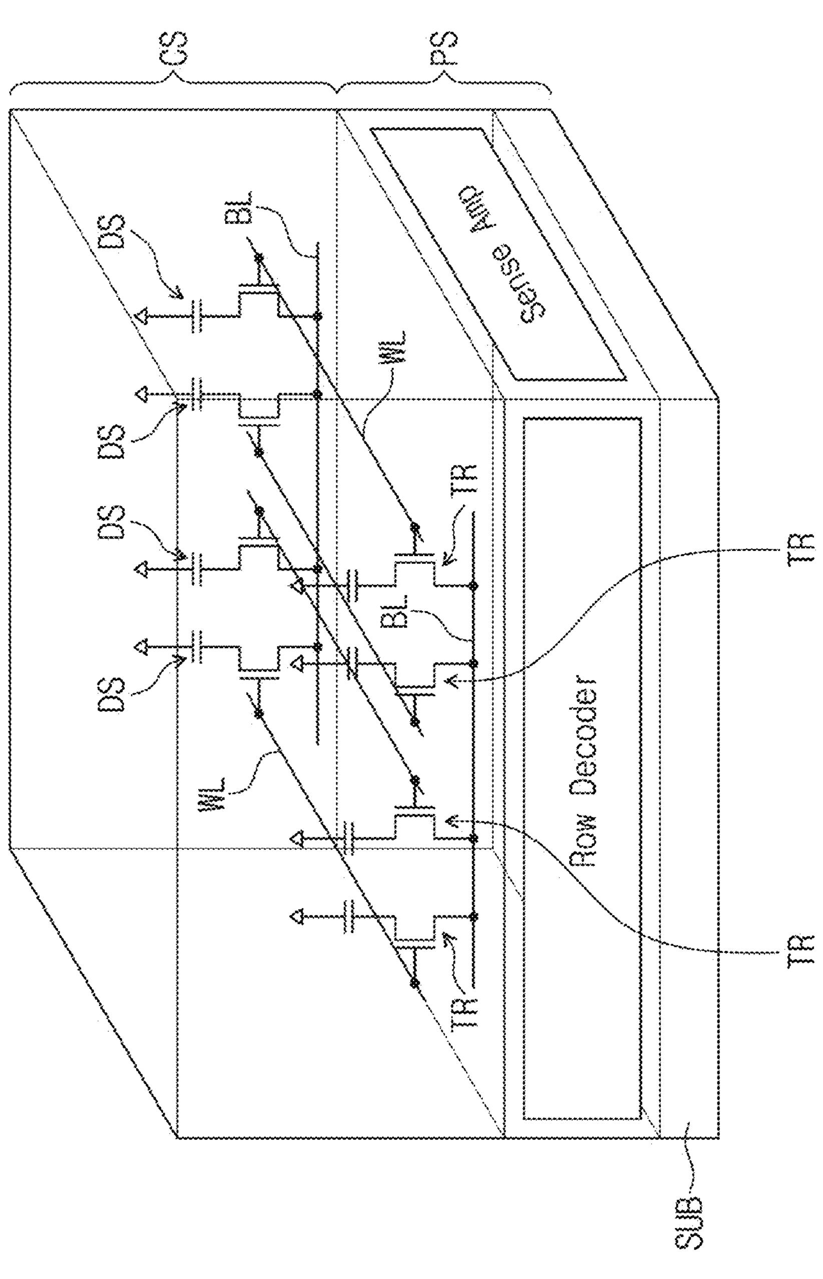
FIGS. 2 and 3 are perspective views schematically illustrating a semiconductor memory device according to embodiments of inventive concepts.
Figure 2:
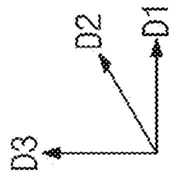
Figure 3:
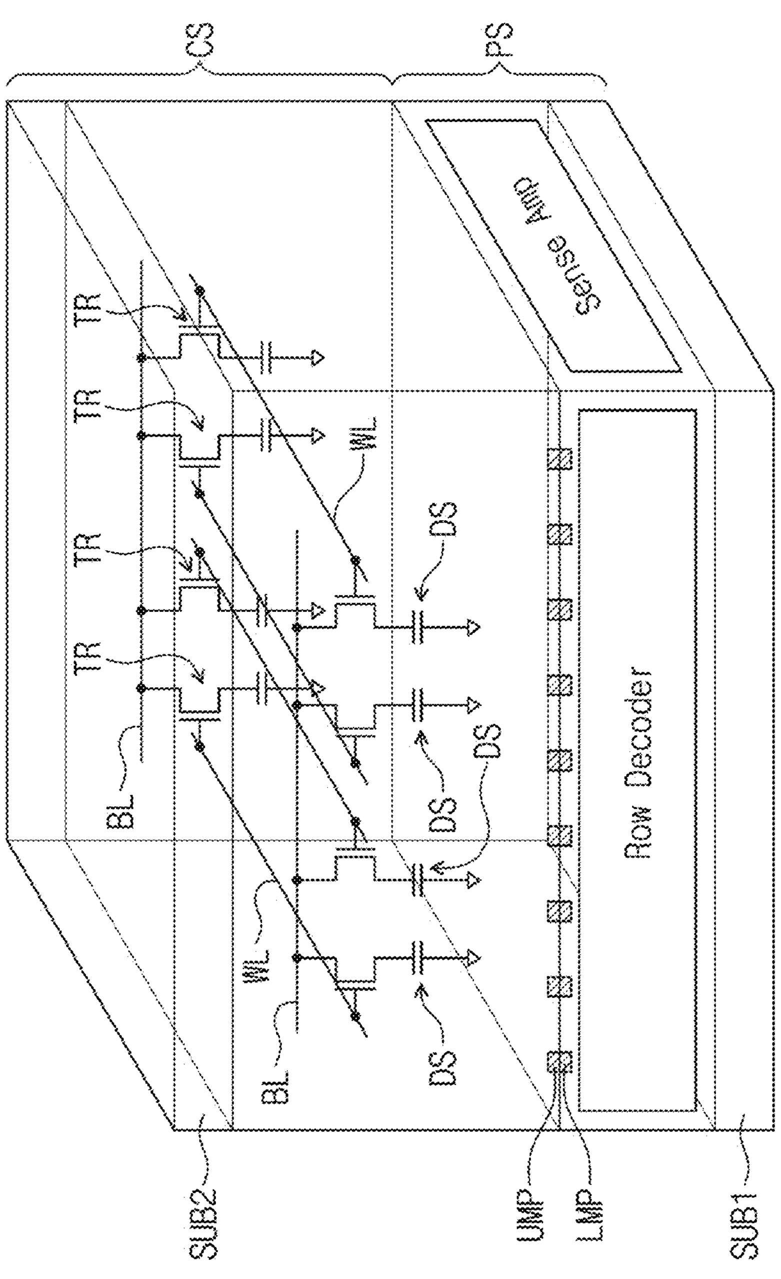
Figure 3:
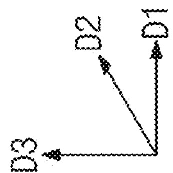

FIGS. 2 and 3 are perspective views schematically illustrating a semiconductor memory device according to embodiments of inventive concepts. Referring to FIGS. 2 and 3, a semiconductor memory device may include a peripheral circuit structure PS and a cell array structure CS connected to the peripheral circuit structure PS.

The peripheral circuit structure PS may include a core and peripheral circuits formed on a substrate SUB. The core and peripheral circuits may include row and column decoders 2 and 4, a sense amplifier 3, and control logic 5 described with reference to FIG. 1.

The cell array structure CS may include a memory cell array (1 in FIG. 1) including memory cells (MC in FIG. 1) arranged in two dimensions or three dimensions. As described above, each of the memory cells (MC of FIG. 1) may include a selection element TR and a data storage element DS.

According to embodiments of inventive concepts, the selection element TR of each of the memory cells (MC of FIG. 1) may include a vertical channel transistor (VCT). The vertical channel transistor may include a channel whose lengthwise direction is perpendicular to an upper surface of the substrate SUB (e.g., a third direction D3). The data storage element DS of each of the memory cells (MC of FIG. 1) may include a capacitor.

According to the embodiment shown in FIG. 2, the peripheral circuit structure PS may be provided on the substrate SUB, and the cell array structure CS may be provided on the peripheral circuit structure PS.

According to the embodiment shown in FIG. 3, the peripheral circuit structure PS may be provided on a first substrate SUB1, and the cell array structure CS may be provided under a second substrate SUB2. The peripheral circuit structure PS and the cell array structure CS may be sandwiched between the first substrate SUB1 and the second substrate SUB2.

First metal pads LMP may be provided on an uppermost portion of the peripheral circuit structure PS. The first metal pads LMP may be electrically connected to the core and peripheral circuits (e.g., row decoder 2, sense amplifier 3, column decoder 4, and control logic 5 in FIG. 1).

Second metal pads UMP may be provided at a lowermost portion of the cell array structure CS. The second metal pads UMP may be electrically connected to the memory cell array (1 in FIG. 1). The second metal pads UMP may be in direct contact with and be bonded to the first metal pads LMP of the peripheral circuit structure PS.

Figure 4:
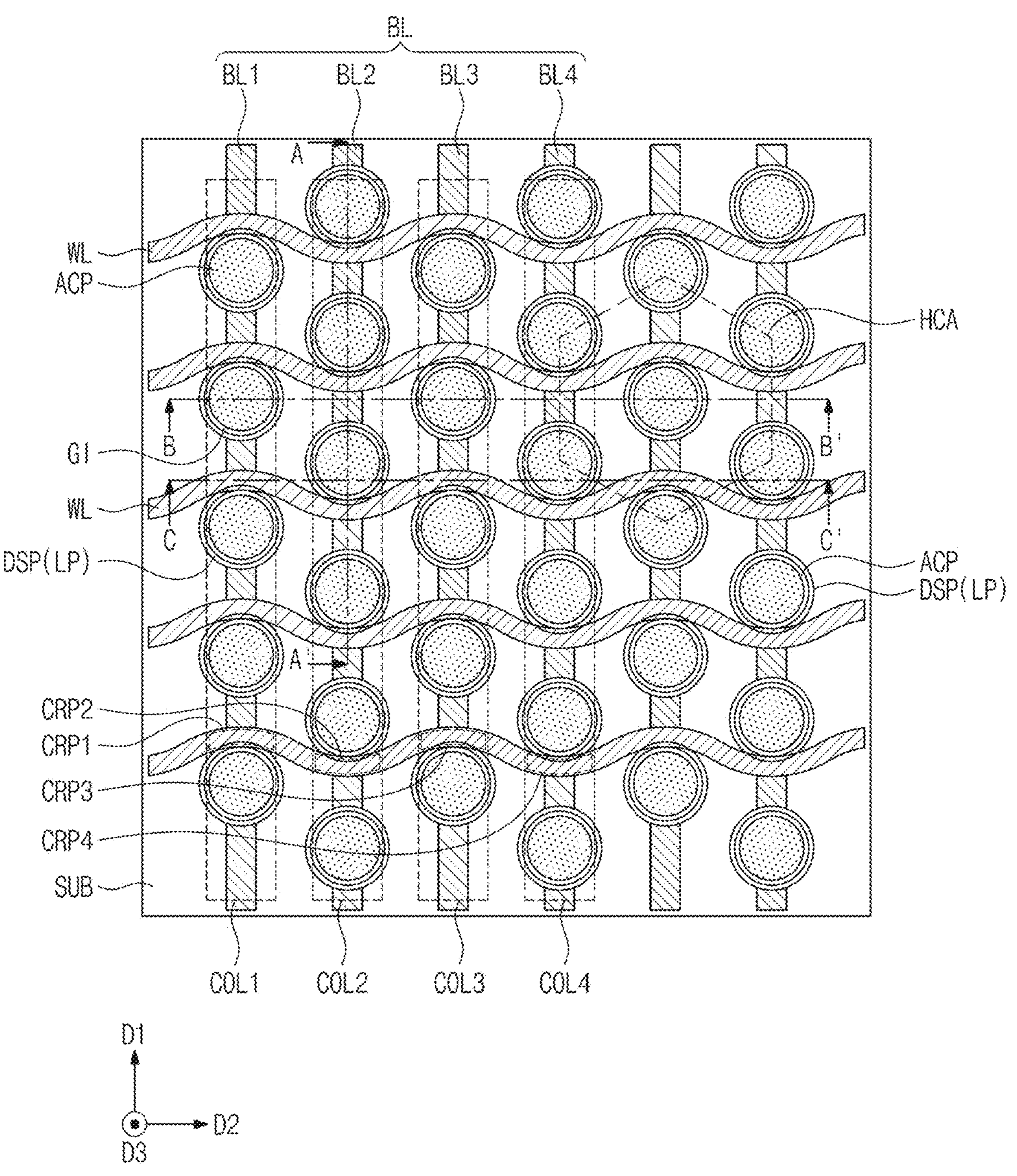
FIG. 4 is a plan view of a semiconductor memory device according to embodiments of inventive concepts.
Figure 5A:
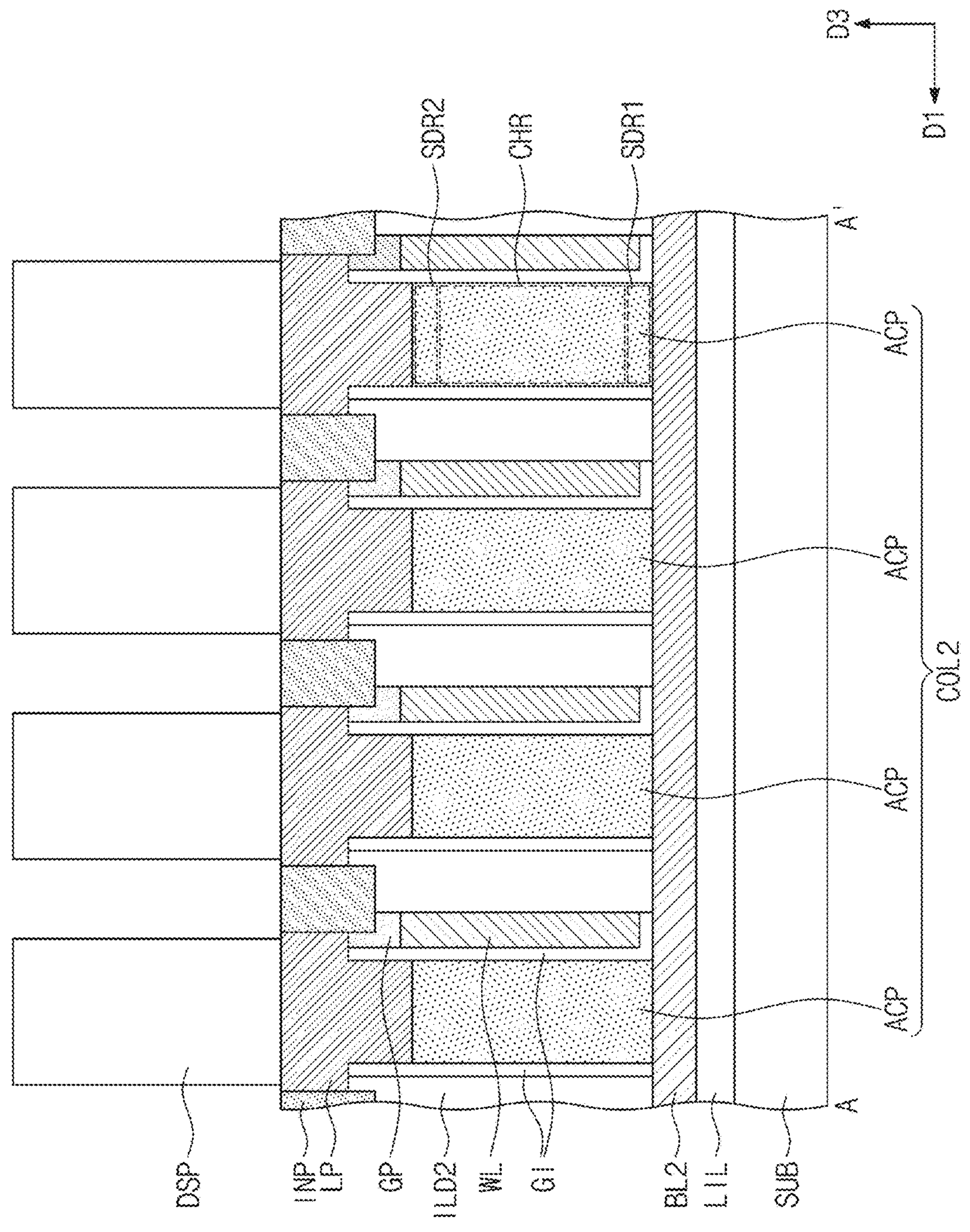
FIG. 5A is a cross-sectional view taken along line A-A' of FIG. 4.
Figure 5B:
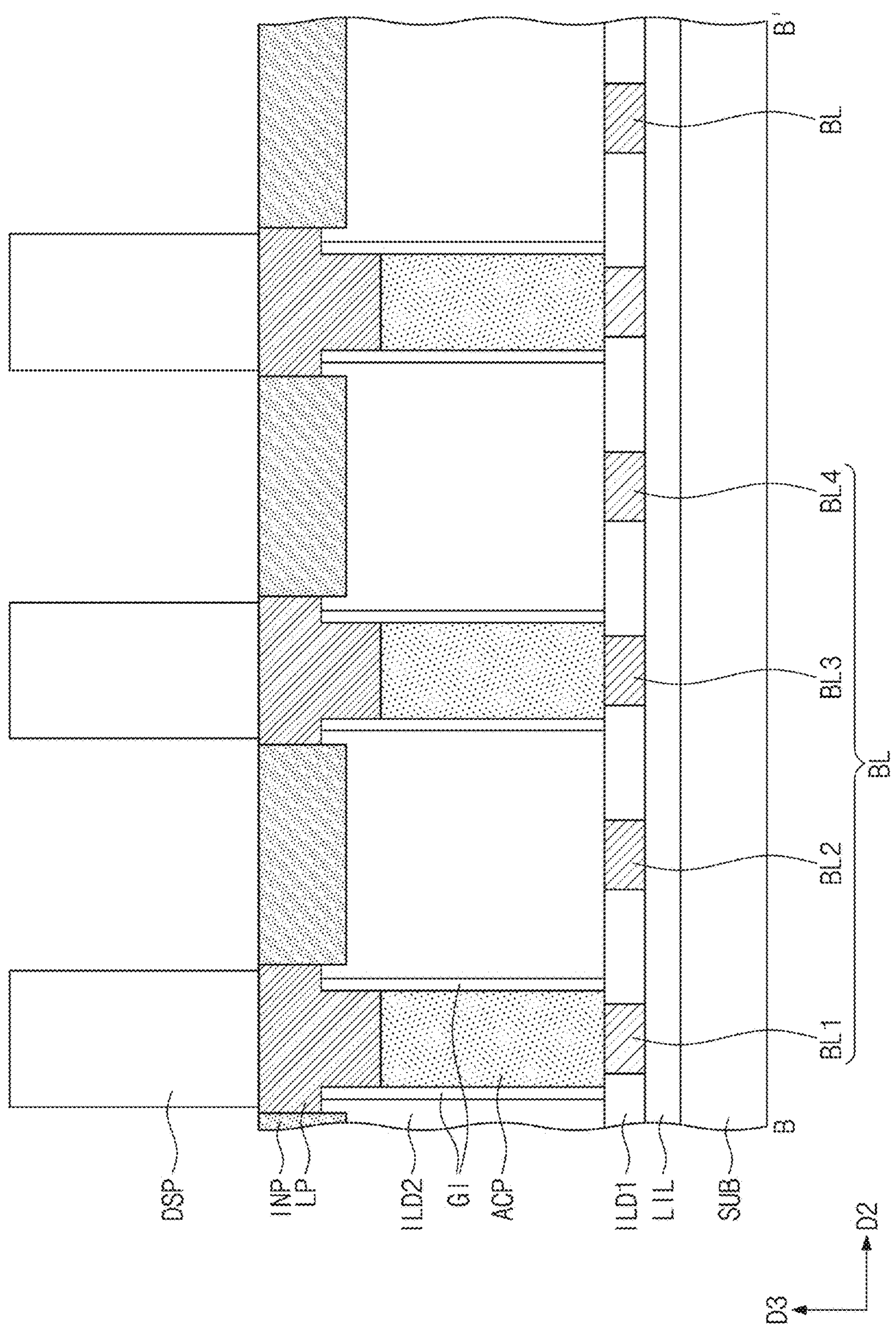
FIG. 5B is a cross-sectional view taken along line B-B' of FIG. 4.
Figure 5C:
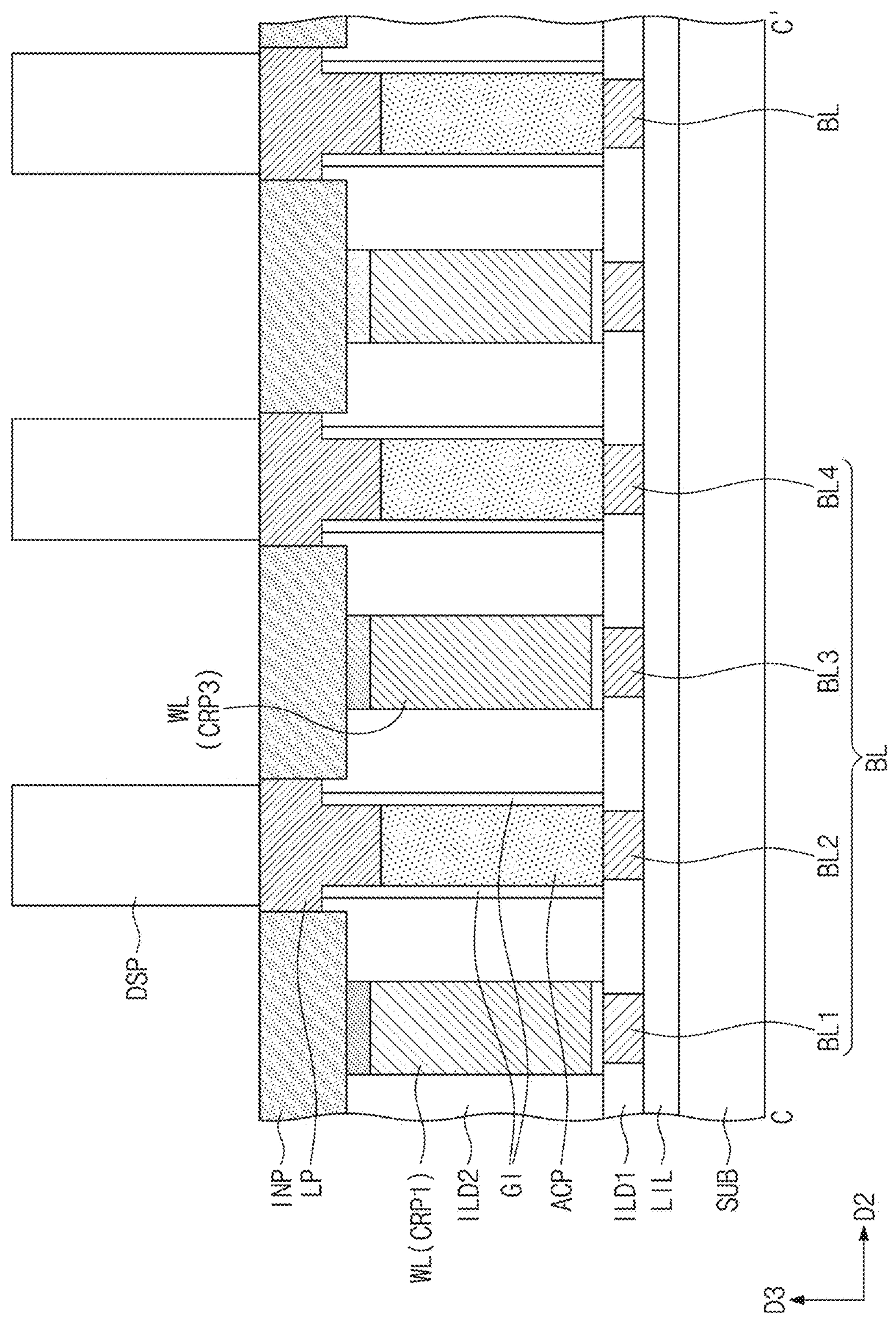
FIG. 5C is a cross-sectional view taken along line C-C' of FIG. 4.
Figure 6A:
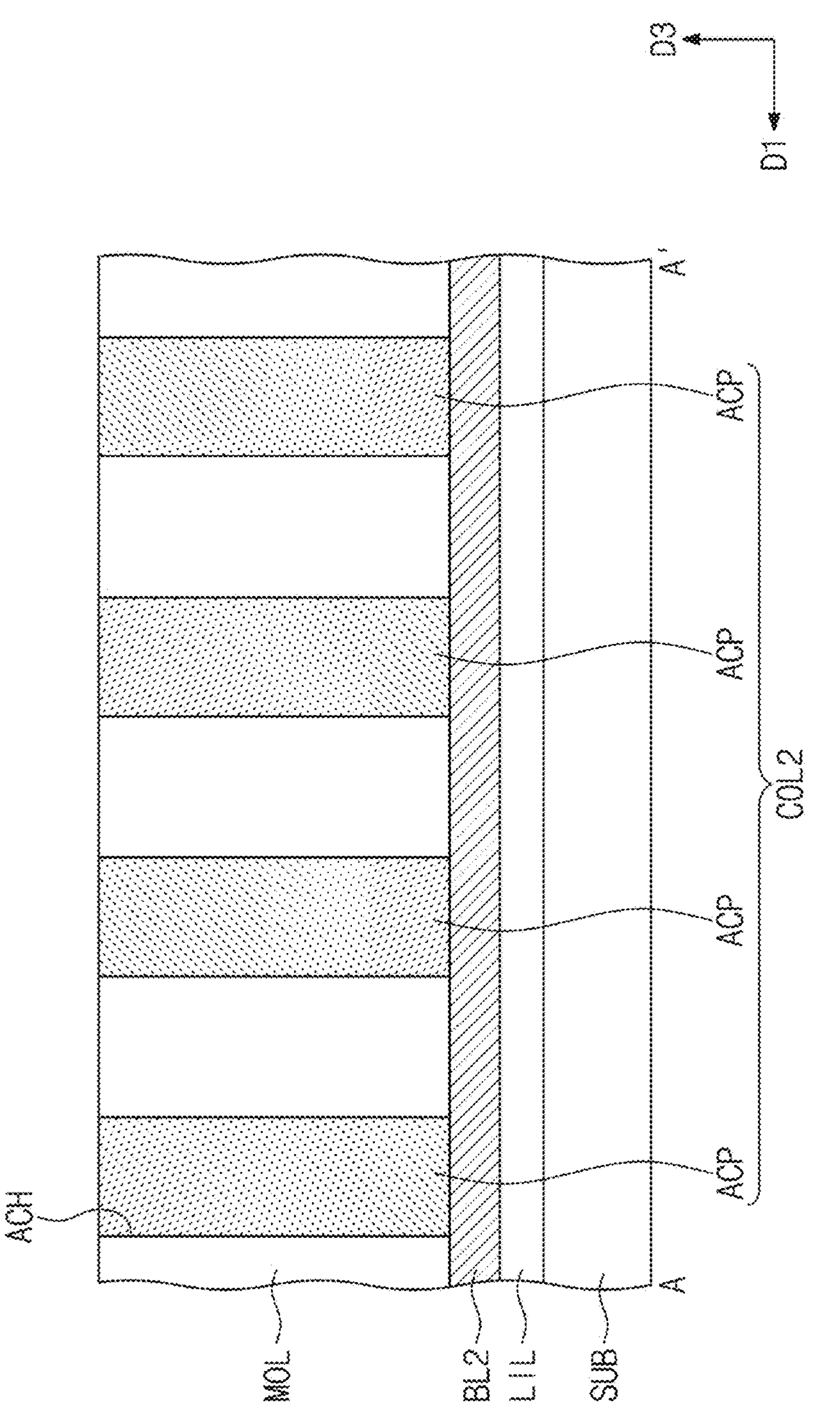
FIGS. 6A to 10C are cross-sectional views illustrating a method of manufacturing a semiconductor memory device according to embodiments of inventive concepts.
Figure 6B:
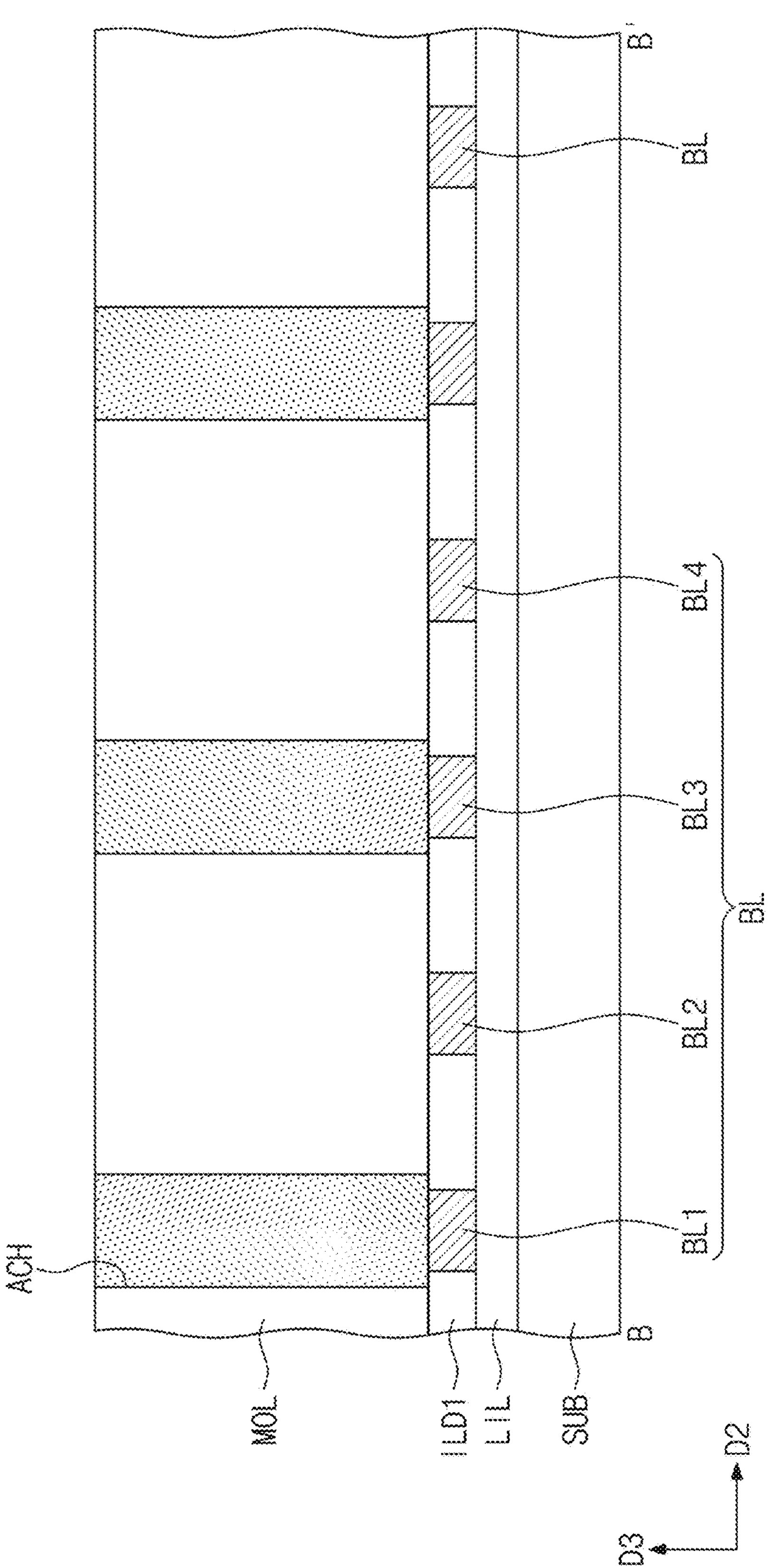
Figure 6C:
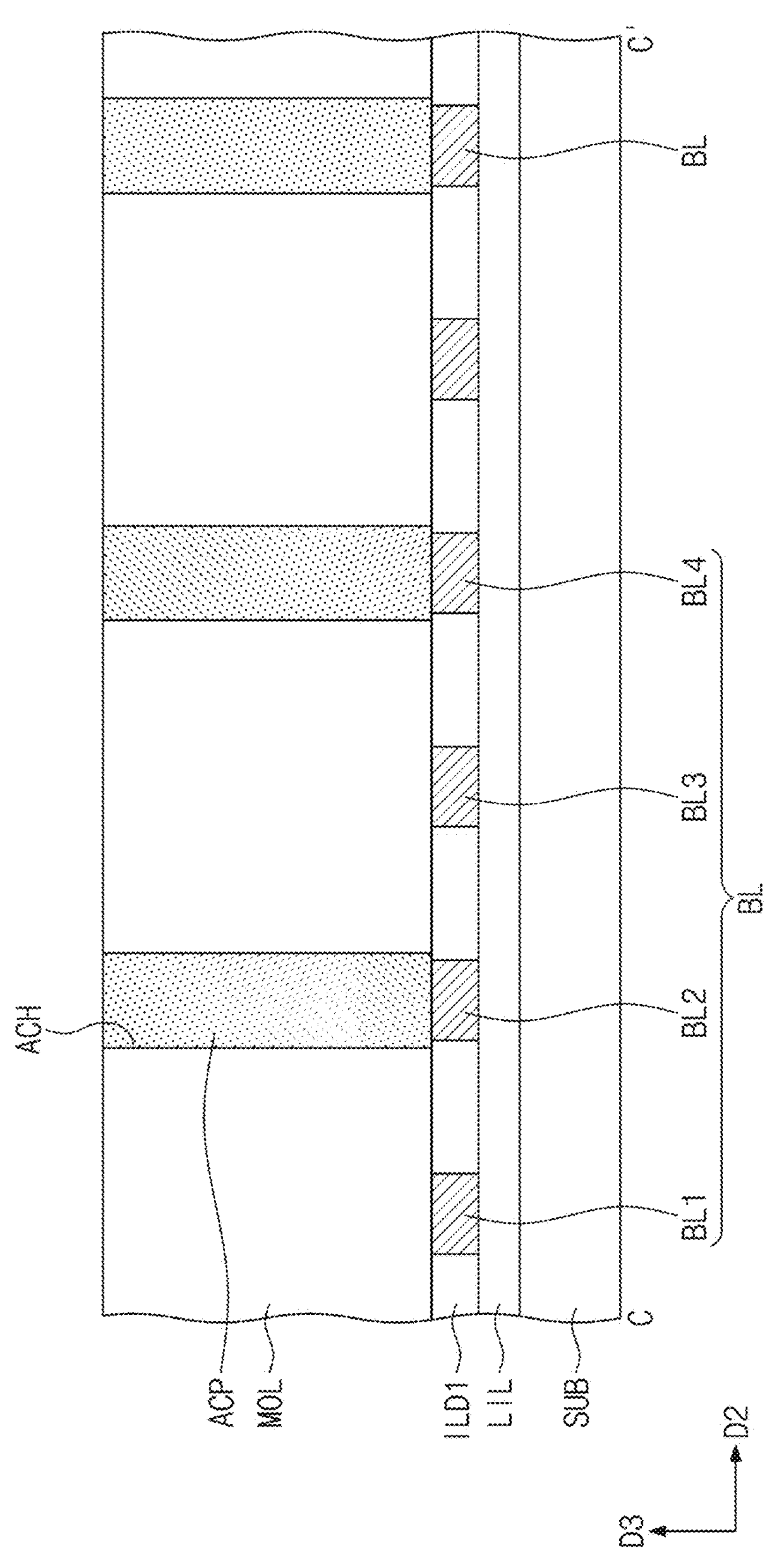
Figure 7A:
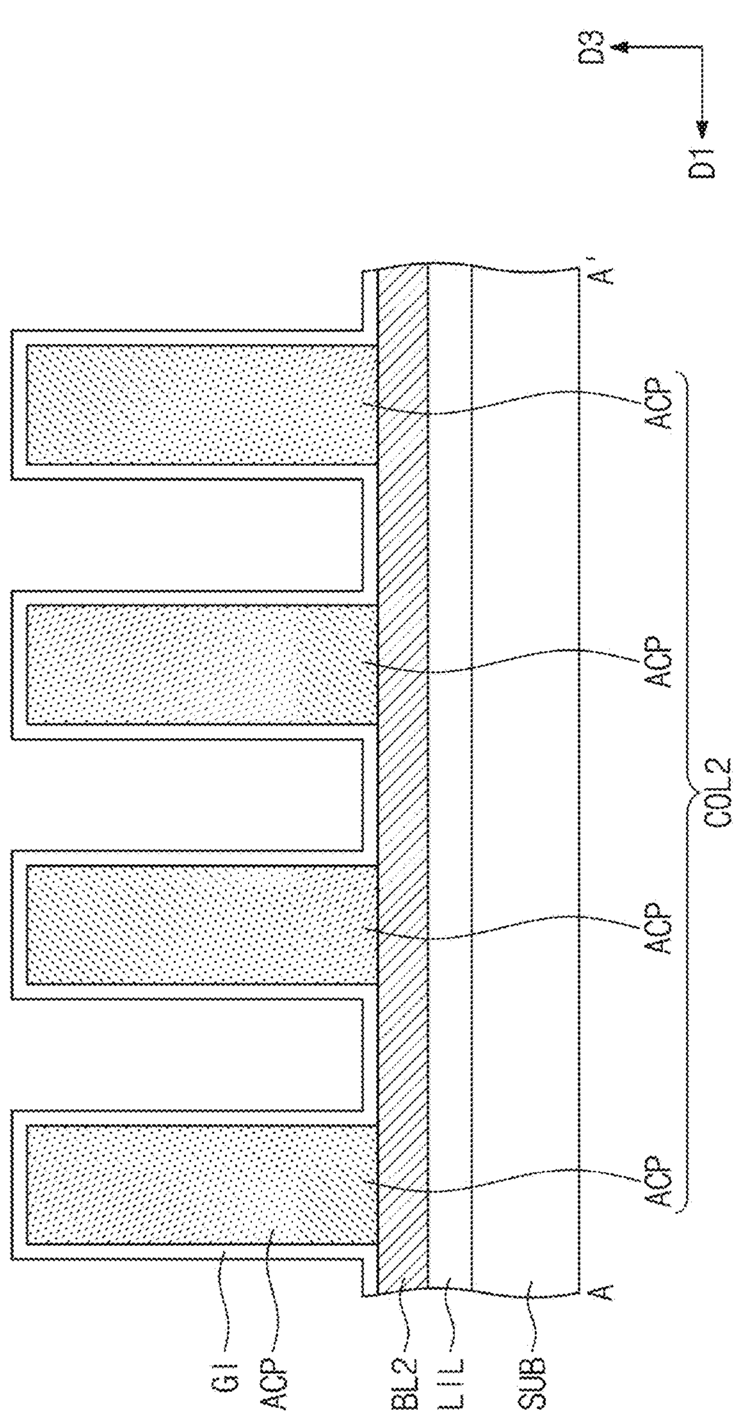
Figure 7B:
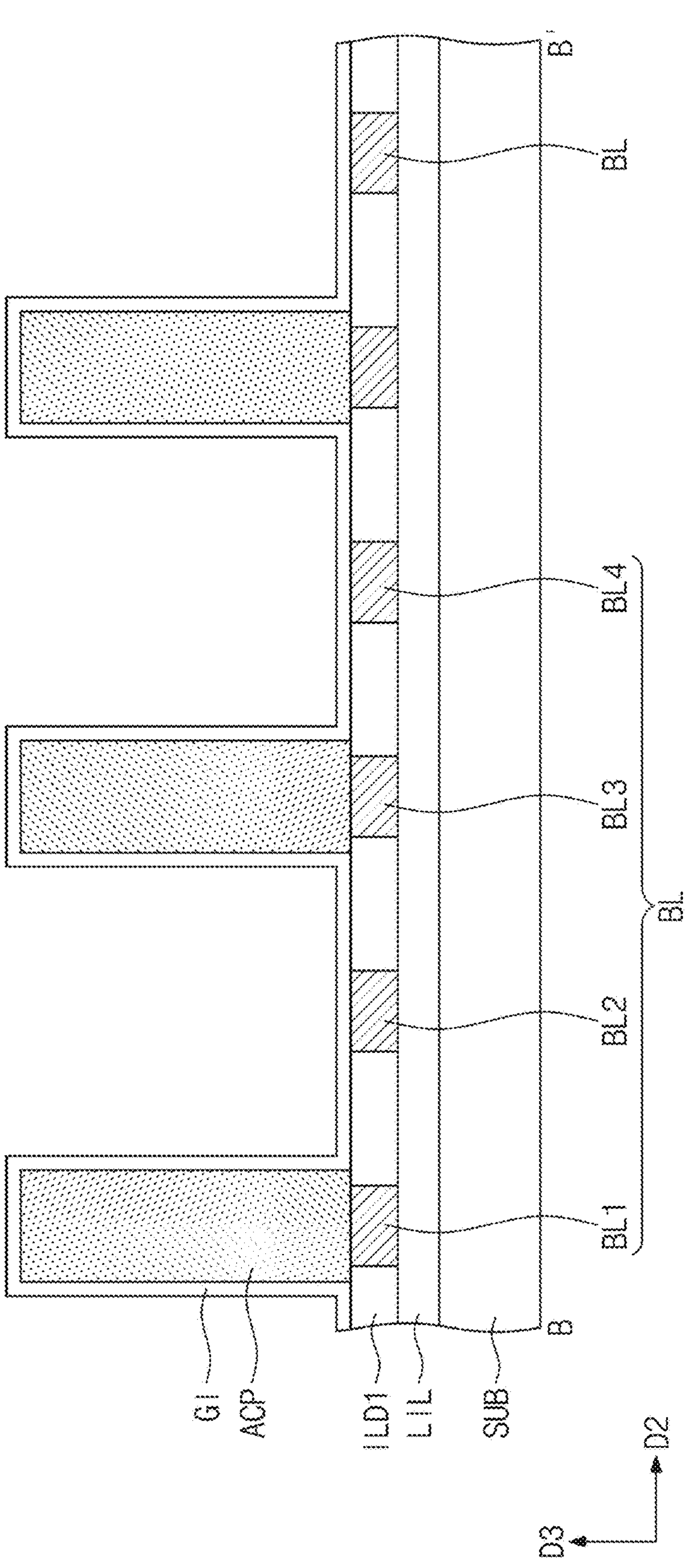
Figure 7C:
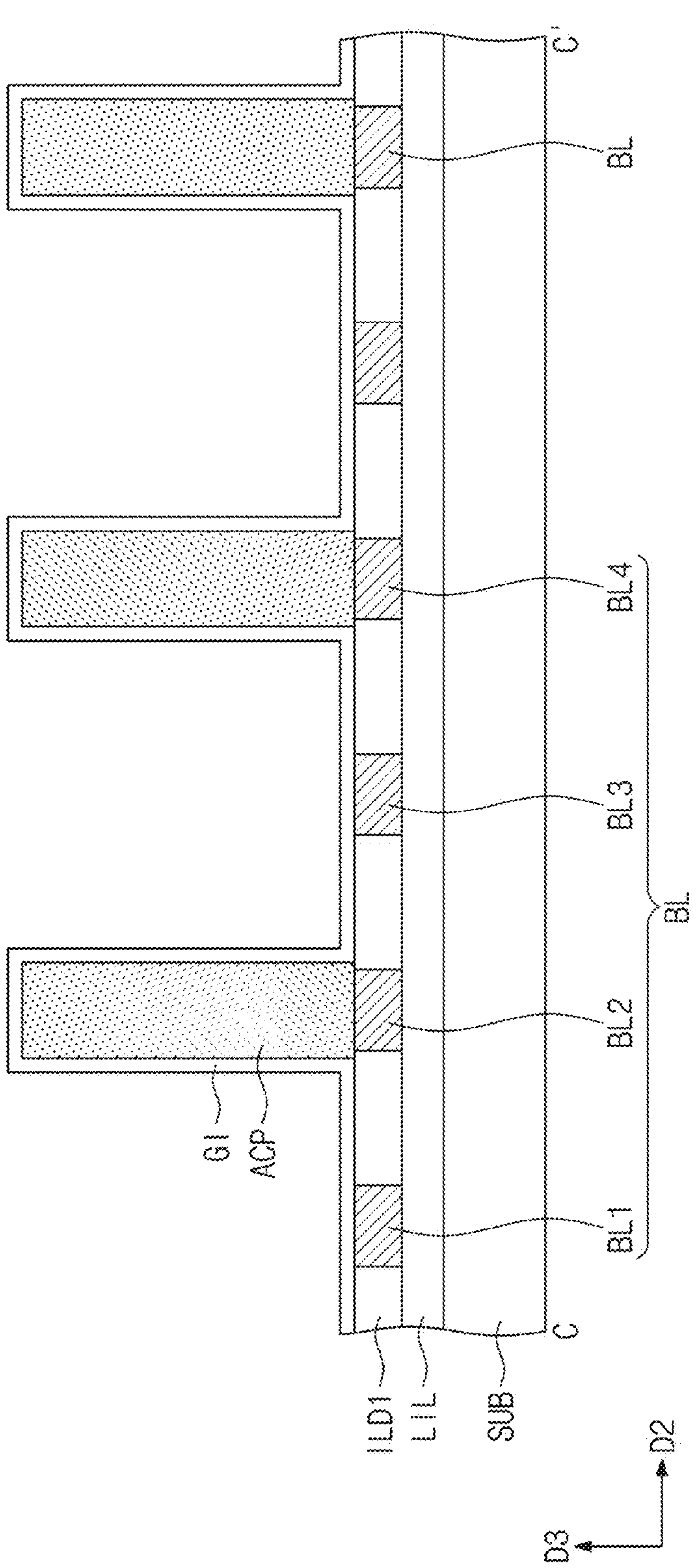
Figure 8A:
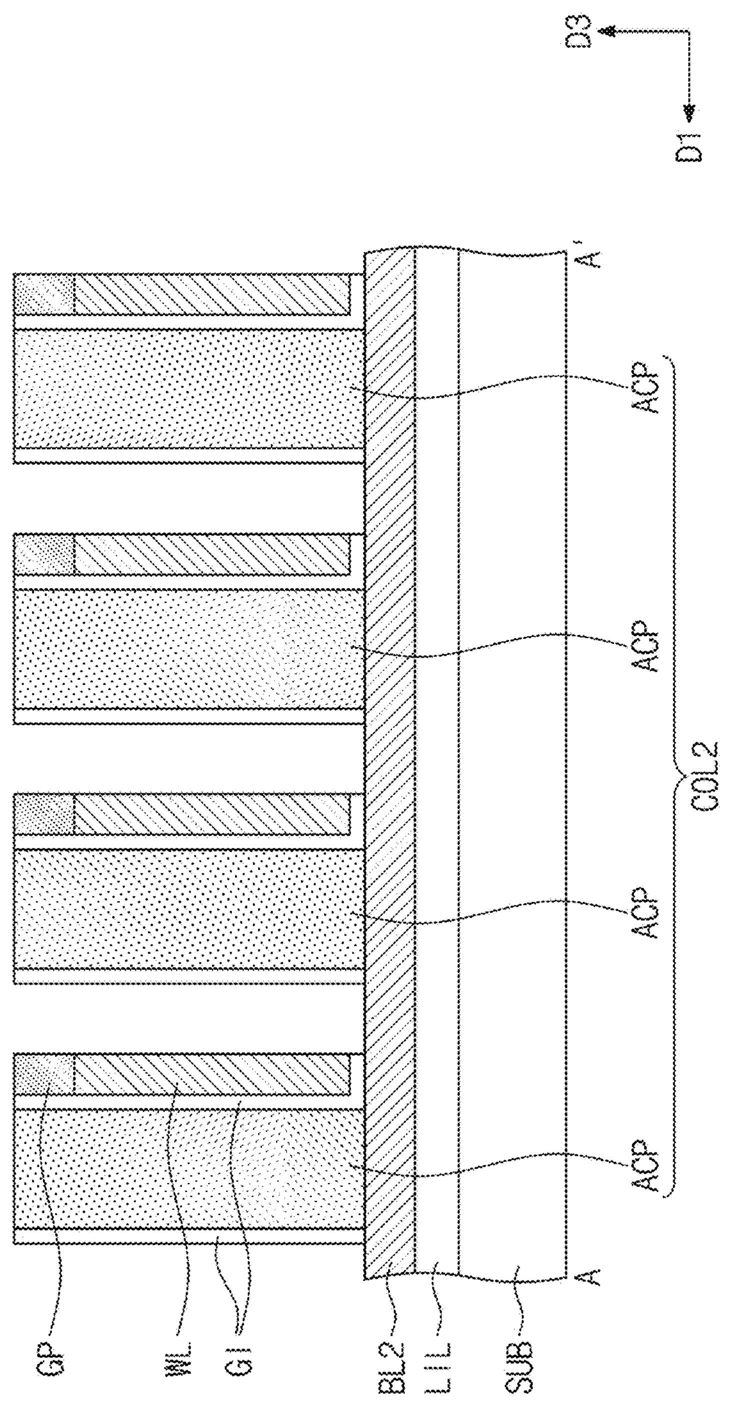
Figure 8B:
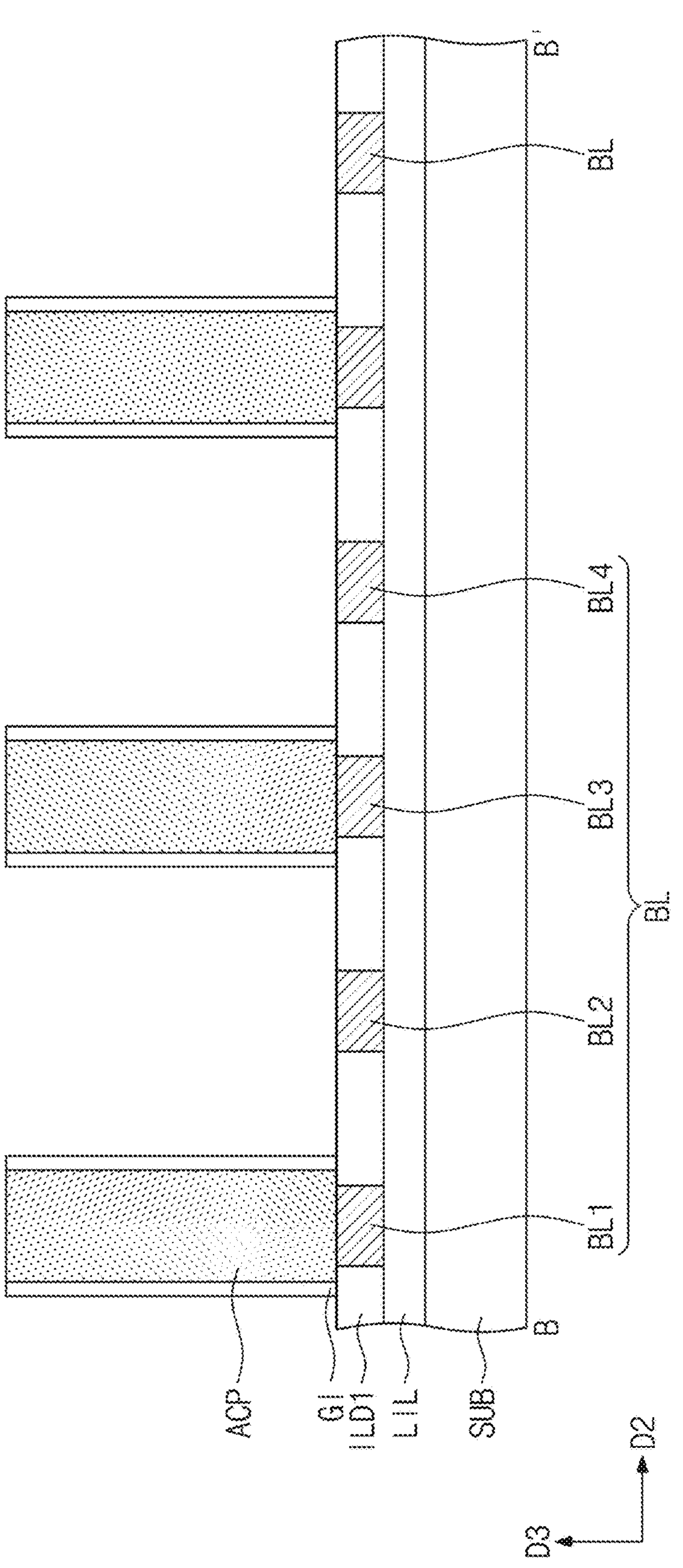
Figure 8C:
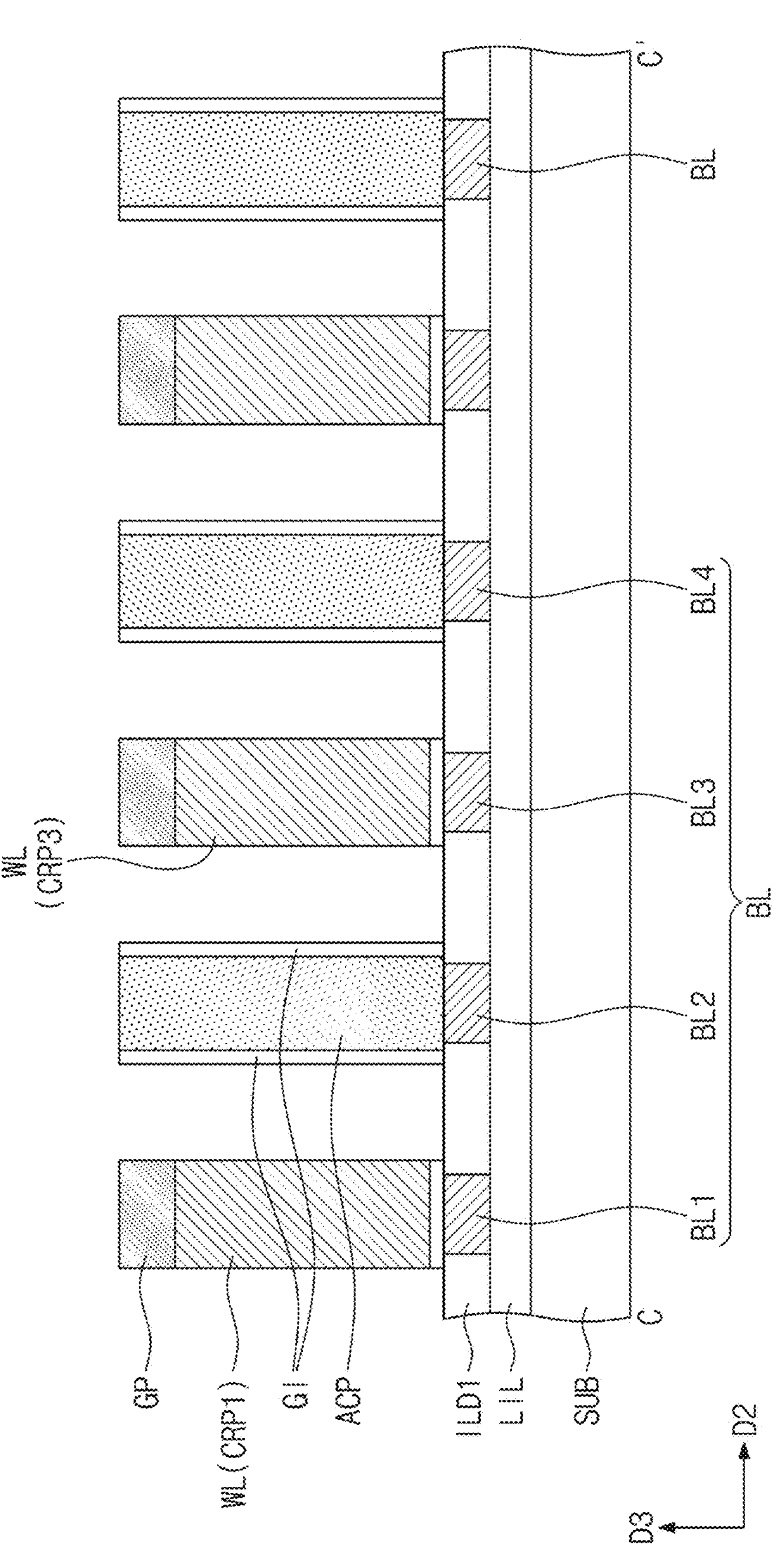
Figure 9A:
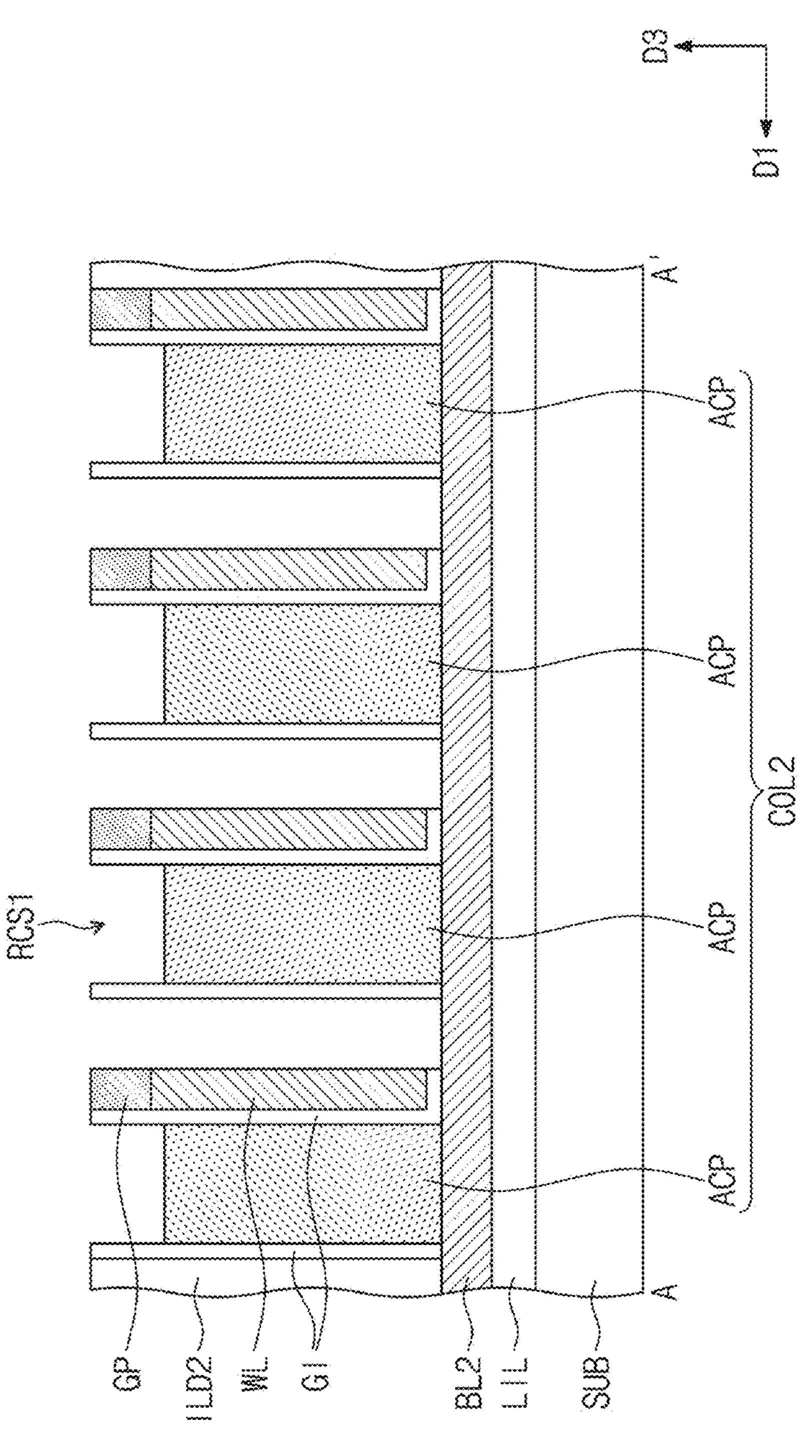
Figure 9B:
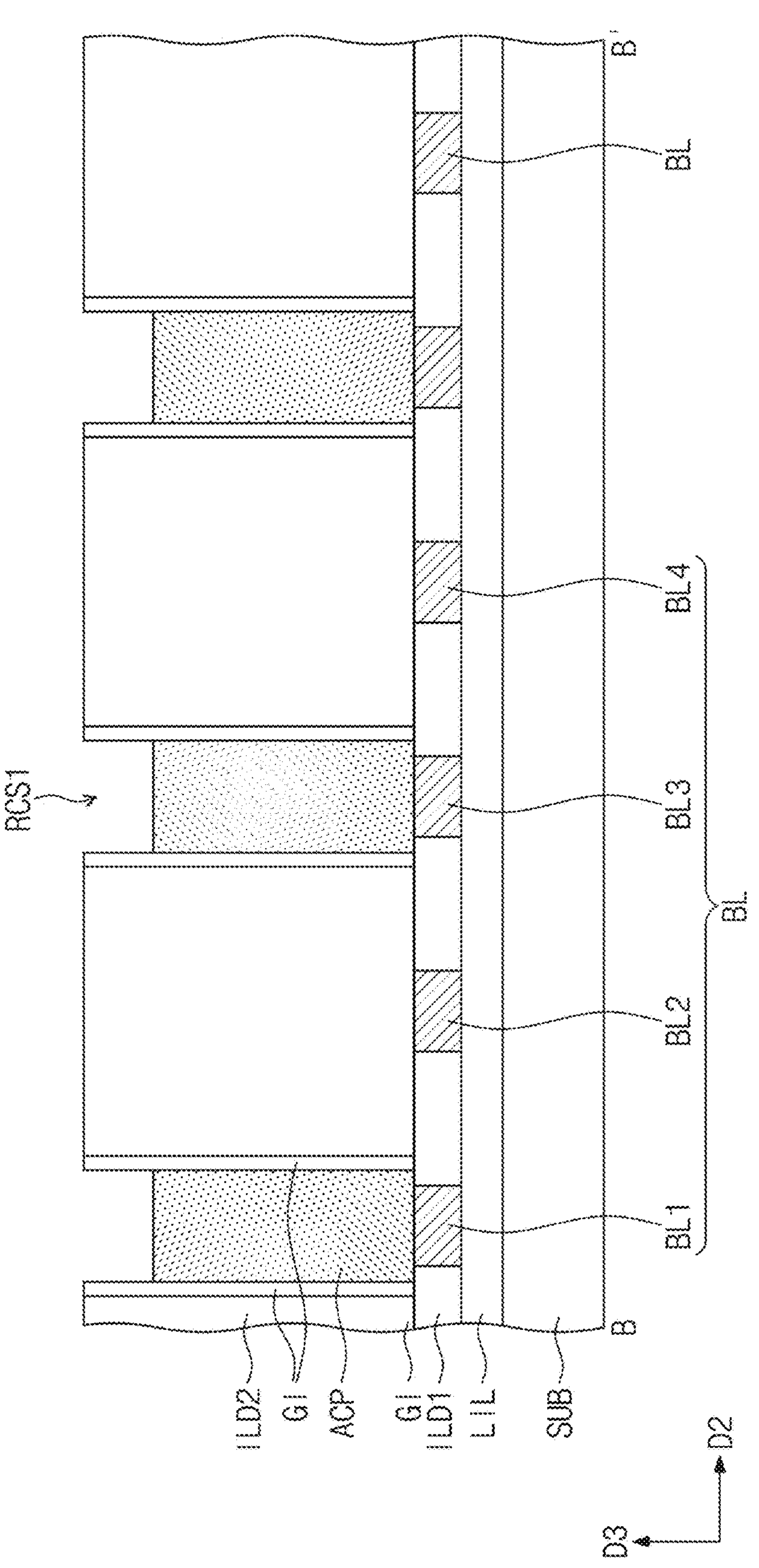
Figure 9C:
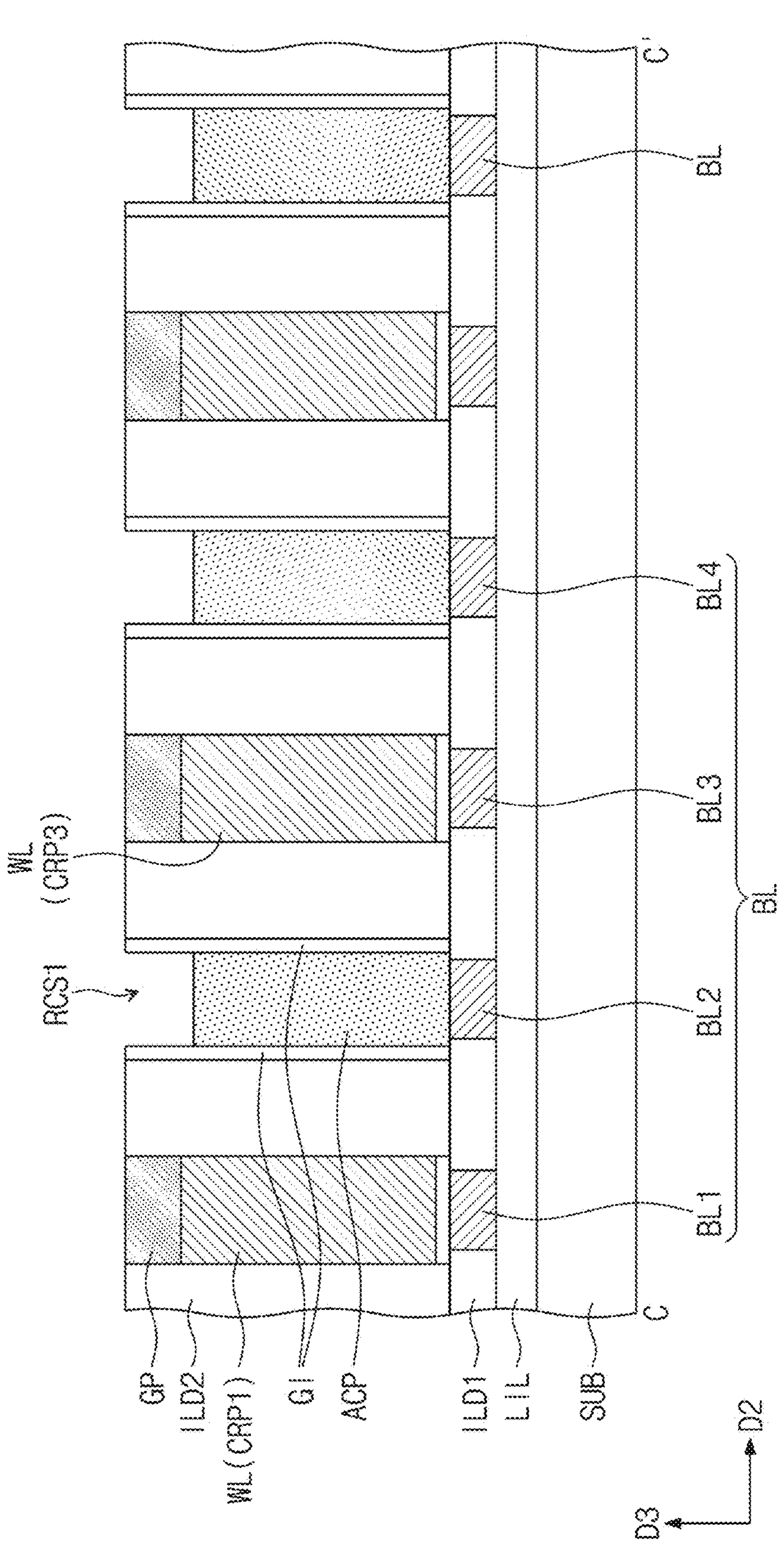
Figure 10A:
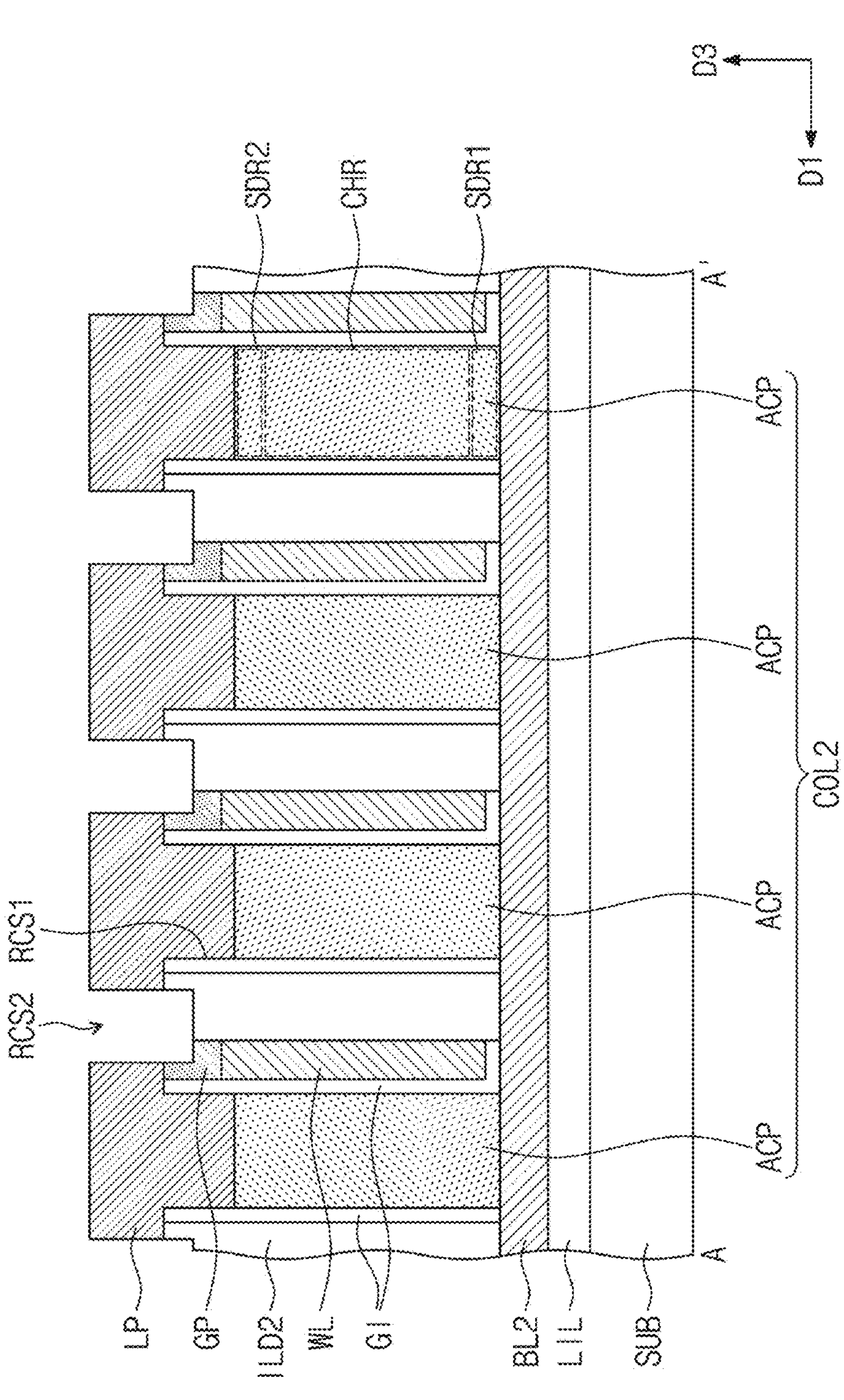
Figure 10B:
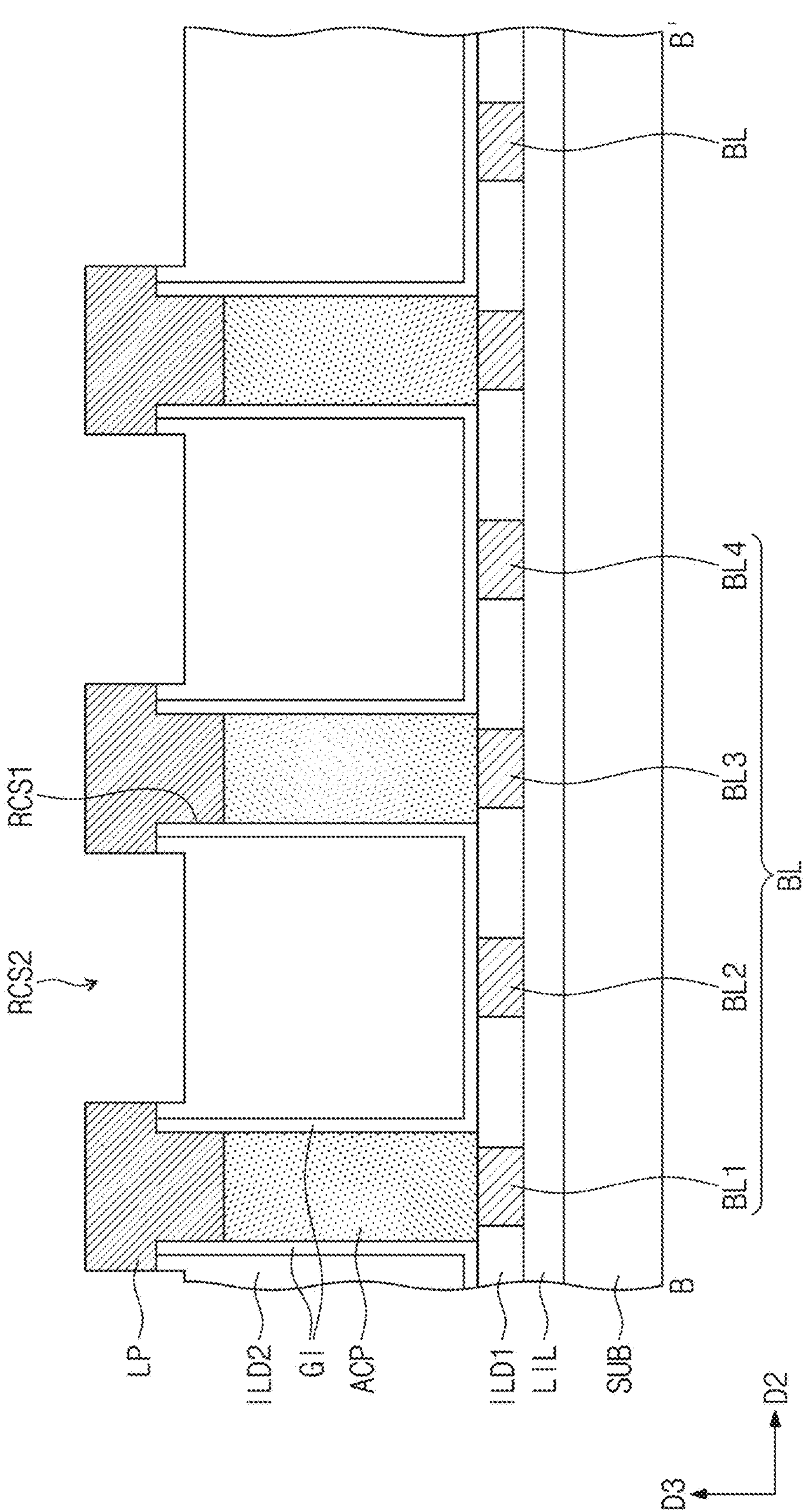
Figure 10C:
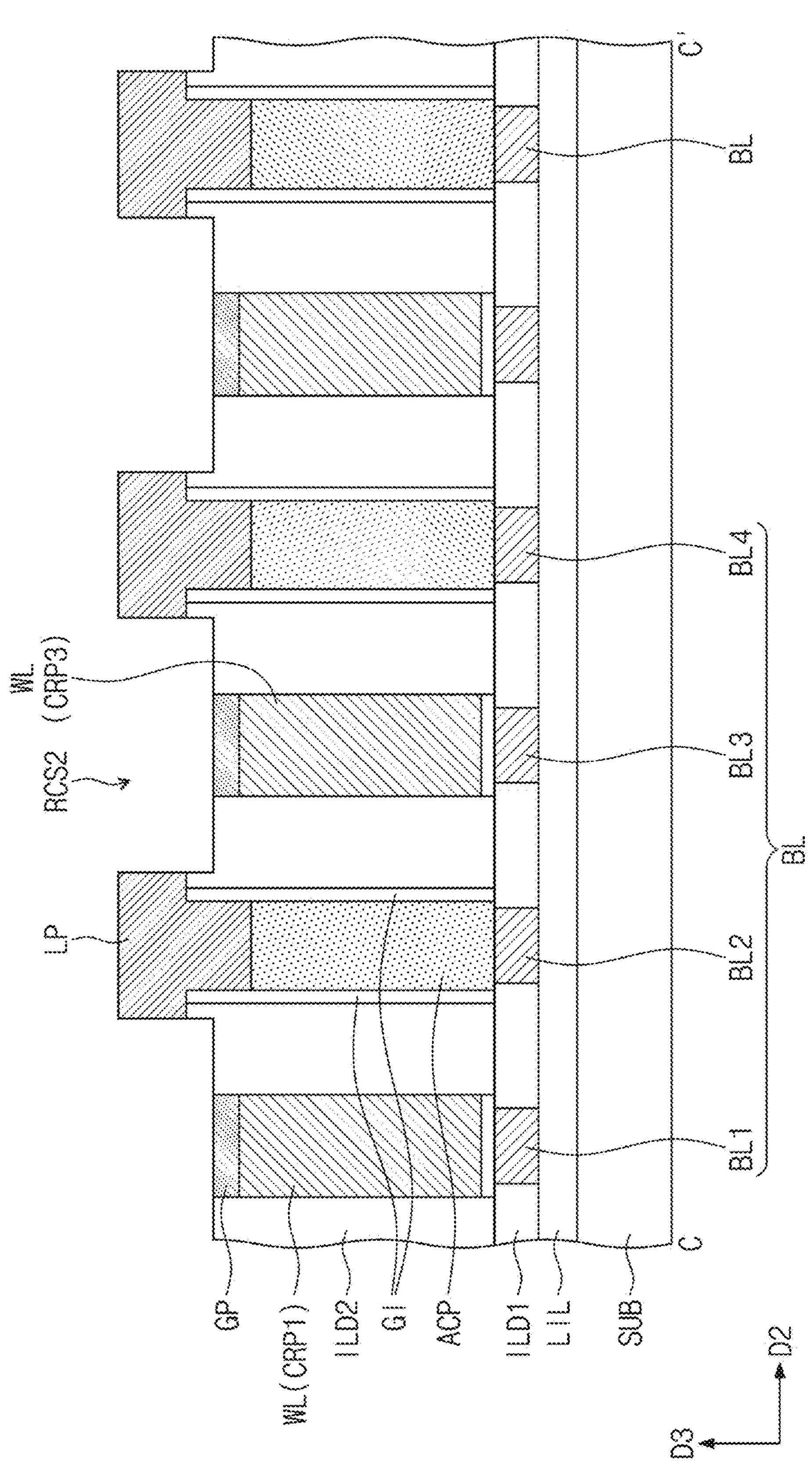

FIG. 4 is a plan view of a semiconductor memory device according to embodiments of inventive concepts. FIG. 5A is a cross-sectional view taken along line A-A' of FIG. 4. FIG. 5B is a cross-sectional view taken along line B-B' of FIG. 4. FIG. 5C is a cross-sectional view taken along line C-C' of FIG. 4.

Referring to FIGS. 4 and 5A to 5C, a lower insulating layer LIL may be provided on a substrate SUB. For example, a peripheral circuit structure PS described above with reference to FIG. 2 may be provided between the substrate SUB and the lower insulating layer LIL. As another example, an integrated circuit such as a logic device may be provided between the substrate SUB and the lower insulating layer LIL.

A first interlayer insulating layer ILD1 may be provided on the lower insulating layer LIL. A plurality of bit lines BL may be provided in the first interlayer insulating layer ILD1. The bit lines BL may extend parallel to each other in a first direction D1. The bit lines BL may be arranged by a certain pitch in a second direction D2. A line width of each of the bit lines BL may be about 1 nm to about 50 nm.

For example, the bit lines BL may include at least one of a doped semiconductor material (e.g., doped silicon, doped germanium, etc.), a conductive metal nitride (e.g., titanium nitride, tantalum nitride, etc.), a metal (e.g., tungsten, titanium, tantalum, etc.), and a metal-semiconductor compound (tungsten silicide, cobalt silicide, titanium silicide, etc.). Each of the bit lines BL may include a single conductive layer or multiple conductive layers. The first interlayer insulating layer ILD1 may include a silicon oxide layer, a silicon nitride layer, a silicon oxynitride layer, and/or a low dielectric layer.

Active pillars ACP may be provided on the bit lines BL. Each of the active pillars ACP may have a cylindrical shape. A lengthwise direction of the active pillar ACP may be parallel to a third direction D3. A bottom surface of the active pillar ACP may be in direct contact with an upper surface of the bit line BL. A diameter of the active pillar ACP may be equal to or greater than a line width of the bit line BL. The active pillar ACP may have a diameter of about 1 nm to about 30 nm.

The active pillars ACP may be two-dimensionally disposed on the first interlayer insulating layer ILD1. The active pillars ACP may be arranged by a certain pitch along the bit line BL, that is, in the first direction D1.

Each of the active pillars ACP may have both ends opposite to each other in the third direction D3. The active pillar ACP may include a first source/drain region SDR1 and a second source/drain region SDR2 provided at both ends thereof, respectively. The active pillar ACP may further include a channel region CHR between the first and second source/drain regions SDR1 and SDR2. The channel region CHR of the active pillar ACP may be controlled by a word line WL adjacent thereto.

In one embodiment of inventive concepts, each of the active pillars ACP may include at least one of an oxide semiconductor and a two-dimensional material. The active pillar ACP may have a bandgap energy greater than that of silicon. For example, the active pillar ACP may have a bandgap energy of about 1.5 eV to about 5.6 eV. In more detail, the active pillar ACP may have optimal channel performance when the active pillar ACP has a bandgap energy of about 2.0 eV to about 4.0 eV.

In detail, the oxide semiconductor may include a compound of oxygen (O) and at least two metals selected from the group consisting of zinc (Zn), indium (In), gallium (Ga), and tin (Sn). For example, the active pillar ACP may include at least one amorphous oxide semiconductor selected from the group consisting of InGaZnO, InGaSiO, InSnZnO, InZnO, ZnO, ZnSnO, ZnON, ZrZnSnO, SnO, HfInZnO, GaZnSnO, AlZnSnO, YbGaZnO, and InGaO.

In detail, the two-dimensional material may include metal chalcogenide, transition metal chalcogenide, graphene, phosphorene, or carbon nanotube. The metal chalcogenide or transition metal chalcogenide may be a metal compound represented by the formula MXy (e.g., "y" is an integer of 1, 2 or 3). In the above formula, "M" is a metal or transition metal atom, and may include, for example, W, Mo, Ti, Zn or Zr. "X" is a chalcogen atom and may include, for example, S, Se, O or Te. For example, the two-dimensional material may include one selected from the group consisting of graphene, phosphorene, $MoS_2$, $MoSe_2$, $MoTe_2$, $WS_2$, $WSe_2$, $WTe_2$, $ReS_2$, $ReSe_2$, $TiS_2$, $TiSe_2$, $TiTe_2$, ZnO, $ZnS_2$, $WO_3$, and $MoO_3$.

The active pillar ACP may have a monolayer structure or a multi-layer structure in which 2 to 100 layers are stacked. The multi-layer structure may be configured to combine a single layer and another single layer adjacent thereto by van der Waals forces.

In another embodiment of inventive concepts, the active pillar ACP may include a semiconductor such as silicon, germanium, or silicon-germanium.

Referring back to FIG. 4, the bit lines BL include a first bit line BL1, a second bit line BL2, a third bit line BL3, and fourth bit line BL4 which are sequentially arranged in a second direction D2.

The active pillars ACP provided on the first bit line BL1 may constitute a first column COL1. The active pillars ACP provided on the second bit line BL2 may constitute a second column COL2. The active pillars ACP provided on the third bit line BL3 may constitute a third column COL3. The active pillars ACP provided on the fourth bit line BL4 may constitute a fourth column COL4.

Columns adjacent to each other may be offset in the first direction D1. For example, the active pillars ACP of the second column COL2 may be offset from the active pillars ACP of the first column COL1 in the first direction D1. The active pillars ACP of the fourth column COL4 may be offset from the active pillars ACP of the third column COL3 in the first direction D1.

The active pillars ACP of the first column COL1 and the active pillars ACP of the third column COL3 may be aligned with each other in the second direction D2. The active pillars ACP of the second column COL2 and the active pillars ACP of the fourth column COL4 may be aligned with each other in the second direction D2.

The active pillars ACP may be arranged in a honeycomb structure. In more detail, a hexagon HCA connecting centers of six adjacent active pillars ACP may be defined. One active pillar ACP may be provided at the center of the hexagon HCA. The active pillars ACP may be arranged in a honeycomb structure, and thus the number of active pillars ACP provided within a unit area may be maximized. Accordingly, integration of the semiconductor memory device may be improved.

Referring again to FIGS. 4 and 5A to 5C, word lines WL may extend parallel to each other in the second direction D2. Each of the word lines WL may cross between adjacent active pillars ACP and extend meanderingly. When viewed in a plan view, the word line WL may have a wavy profile. The active pillars ACP adjacent to the word line WL may be arranged in a zigzag shape in the second direction D2 along the word line WL.

In an embodiment of inventive concepts, the word line WL may include a first curved portion CRP1 adjacent to the active pillar ACP of the first column COL1, a second curved portion CRP2 adjacent to the active pillar ACP of the second column COL2, a third curved portion CRP3 adjacent to the active pillar ACP of the third column COL3, and a fourth curved portion CRP4 adjacent to the active pillar ACP of the fourth column COL4. The first to fourth curved portions CRP1 to CRP4 may be connected to each other.

Each of the first and third curved portions CRP1 and CRP3 may protrude toward the first direction D1. Each of the second and fourth curved portions CRP2 and CRP4 may protrude in a direction opposite to the first direction D1. For example, the first curved portion CRP1 may be curved along a curved surface of the active pillar ACP of the first column COL1. As the first curved portion CRP1 has a profile surrounding the active pillar ACP of the first column COL1, controllability of the word line WL with respect to a channel region may be improved.

For example, the word lines WL may include at least one of a doped semiconductor material (e.g., doped silicon, doped germanium, etc.), a conductive metal nitride (e.g., titanium nitride, tantalum nitride, etc.), or a metal (e.g., tungsten, titanium, tantalum, etc.), and a metal-semiconductor compound (e.g., tungsten silicide, cobalt silicide, titanium silicide, etc.).

A gate insulating layer GI may be provided on sidewalls of the active pillar ACP. The gate insulating layer GI may have a hollow cylinder shape surrounding the active pillar ACP. The gate insulating layer GI may be interposed between the word line WL and the active pillar ACP. The gate insulating layer GI may also be interposed between the word line WL and the bit line BL. The word line WL may be separated from the bit line BL by the gate insulating layer GI.

The gate insulating layer GI may include a silicon oxide layer, a silicon oxynitride layer, a high dielectric layer having a higher dielectric constant than that of the silicon oxide layer, or a combination thereof. The high dielectric layer may be formed of metal oxide or metal oxynitride. For example, the high dielectric layer may include $HfO_2$, HfSiO, HfSiON, HfTaO, HfSiO, HfZrO, $ZrO_2$, or $Al_2O_3$.

A gate capping pattern GP may be provided on each of the word lines WL. The gate capping pattern GP may cover an upper surface of the word line WL. When viewed in a plan view, the gate capping pattern GP may overlap the word line WL. The gate capping pattern GP may include a silicon nitride layer or a silicon oxynitride layer.

A second interlayer insulating layer ILD2 may fill between word lines WL and between active pillars ACP. For example, the second interlayer insulating layer ILD2 may include a silicon oxide layer, a silicon nitride layer, a silicon oxynitride layer, and/or a low dielectric layer.

Landing pads LP may be provided on the active pillars ACP, respectively. A lower portion of the landing pad LP may be in contact with an upper surface of the active pillar ACP. When viewed in a plan view, the landing pads LP may be disposed to overlap the active pillars ACP, respectively. That is, an arrangement of the landing pads LP may have the same honeycomb structure as an arrangement of the active pillars ACP. When viewed in a plan view, the landing pad LP may have various shapes such as a circular shape, an elliptical shape, a rectangular shape, a square shape, a rhombic shape, and a hexagonal shape.

For example, the landing pad LP may include at least one of a doped semiconductor material (e.g., doped silicon, doped germanium, etc.), a conductive metal nitride (e.g., titanium nitride, tantalum nitride, etc.), a metal (e.g., tungsten, titanium, tantalum, etc.), and metal-semiconductor compounds (e.g., tungsten silicide, cobalt silicide, titanium silicide, etc.).

An insulating pattern INP may be provided between the landing pads LP. The landing pads LP may be defined by forming the insulating pattern INP on a metal layer. The insulating pattern INP may be in direct contact with the gate capping pattern GP.

Data storage patterns DSP may be provided on the landing pads LP, respectively. The data storage patterns DSP may be electrically connected to the active pillars ACP through the landing pads LP, respectively. When viewed in a plan view, the data storage patterns DSP may be disposed to overlap the active pillars ACP. That is, an arrangement of the data storage patterns DSP may be the same honeycomb structure as an arrangement of the active pillars ACP.

In an embodiment of inventive concepts, each of the data storage patterns DSP may be a capacitor. The data storage pattern DSP may include a lower electrode, an upper electrode, and a capacitor dielectric layer interposed therebetween. The lower electrode may be in contact with the landing pad LP. For example, the lower electrode may have a pillar shape or a hollow cylinder shape.

In another embodiment of inventive concepts, each of the data storage patterns DSP may be a variable resistance pattern which is switchable between two resistance states by an electrical pulse applied to a memory element. For example, the data storage pattern DSP may include a phase-change material, a perovskite compound, a transition metal oxide, a magnetic material, a ferromagnetic material or an antiferromagnetic material, whose crystalline state changes depending on the amount of current.

FIGS. 6A to 10C are cross-sectional views illustrating a method of manufacturing a semiconductor memory device according to embodiments of inventive concepts. FIGS. 6A, 7A, 8A, 9A, and 10A are cross-sectional views taken along line A-A' of FIG. 4. FIGS. 6B, 7B, 8B, 9B, and 10B are cross-sectional views taken along line B-B' of FIG. 4. FIGS. 6C, 7C, 8C, 9C, AND 10C are cross-sectional views taken along line C-C' of FIG. 4.

Referring to FIGS. 4 and 6A to 6C, a lower insulating layer LIL may be formed on a substrate SUB. The lower insulating layer LIL may include insulating layers stacked on the substrate SUB. For example, the lower insulating layer LIL may include a silicon oxide layer, a silicon nitride layer, a silicon oxynitride layer, and/or a low dielectric layer.

Bit lines BL extending in a first direction D1 may be formed on the lower insulating layer LIL. Forming the bit lines BL may include depositing a conductive layer on the lower insulating layer LIL and patterning the conductive layer. A first interlayer insulating layer ILD1 may be formed between the bit lines BL. An upper surface of the first interlayer insulating layer ILD1 may be coplanar with upper surfaces of the bit lines BL.

In another embodiment of inventive concepts, forming the bit lines BL may include forming trenches in the first interlayer insulating layer ILD1 and filling the trenches with a conductive material.

A mold layer MOL may be formed on the bit lines BL and the first interlayer insulating layer ILD1. A plurality of active holes ACH exposing the bit lines BL may be formed by patterning the mold layer MOL. When viewed in a plan view, the active holes ACH may be arranged in a honeycomb structure.

The mold layer MOL may be formed of an insulating material having etch selectivity with respect to the first interlayer insulating layer ILD1. For example, the mold layer MOL may be formed of a silicon oxide layer, a silicon nitride layer, a silicon oxynitride layer, and/or a low dielectric layer.

In an embodiment of inventive concepts, a patterning process for forming the active holes ACH may include a lithography process using extreme ultraviolet (EUV). In the present specification, EUV may mean ultraviolet rays having a wavelength of 4 nm to 124 nm, a wavelength of 4 nm to 20 nm, or a wavelength of 13.5 nm. EUV may mean light having an energy of 6.21 eV to 124 eV or 90 eV to 95 eV.

The EUV lithography process may include an exposure process and a development process using EUV irradiated onto a photoresist layer. For example, the photoresist layer may be an organic photoresist containing an organic polymer such as polyhydroxystyrene. The organic photoresist may further include a photosensitive compound that reacts to EUV. The organic photoresist may further include a material having high EUV absorption, for example, an organometallic material, an iodine-containing material, or a fluorine-containing material. As another example, the photoresist layer may be an inorganic photoresist containing an inorganic material such as tin oxide.

The photoresist layer may be formed with a relatively thin thickness. Photoresist patterns may be formed by developing the photoresist layer exposed to EUV. When viewed in a plan view, the photoresist patterns may have a honeycomb structure.

Mask patterns may be formed by patterning one or more mask layers stacked under the photoresist patterns as an etch mask. The active holes ACH may be formed by patterning the mold layer MOL using the mask patterns as an etch mask.

For example, a minimum pitch between the active holes ACH formed by the EUV lithography process of the present embodiment may be 45 nm or less. That is, as the EUV lithography process is performed, precise and fine active holes ACH may be formed without multi-patterning technique.

In another embodiment of inventive concepts, the patterning process for forming the active holes ACH may include a multi patterning technique (MPT). The Multi patterning technique may use two or more photo masks.

Active pillars ACP may be formed in the active holes ACH, respectively. Each of the active pillars ACP may have a cylindrical shape. When viewed in a plan view, the active pillars ACP may be arranged in a honeycomb structure.

In an embodiment, forming the active pillars ACP may include filling the active holes ACH with at least one of an oxide semiconductor and a two-dimensional material. The active pillars ACP may be formed by at least one of physical vapor deposition (PVD), thermal chemical vapor deposition (thermal CVD), low pressure chemical vapor deposition (LP-CVD), plasma enhanced chemical vapor deposition (PE-CVD) or atomic layer deposition (ALD).

In another embodiment, forming the active pillars ACP may include filling the active holes ACH with a semiconductor such as silicon, germanium, or silicon-germanium.

Referring to FIGS. 4 and 7A to 7C, the mold layer MOL may be selectively removed. A gate insulating layer GI may be conformally formed on the exposed active pillars ACP. The gate insulating layer GI may directly cover the exposed surface of the active pillar ACP. The gate insulating layer GI may include a silicon oxide layer, a silicon oxynitride layer, a high dielectric layer having a higher dielectric constant than that of the silicon oxide layer, or a combination thereof.

Referring to FIGS. 4 and 8A to 8C, word lines WL adjacent to the active pillars ACP may be formed. In detail, referring to FIG. 4, the word line WL may be formed along the active pillars ACP arranged in a zigzag shape in a second direction D2. As a result, the word line WL may be formed in a wavy shape.

Forming the word line WL may include forming a gate conductive layer on the gate insulating film GI, forming a gate capping pattern GP defining a shape of a word line WL on the gate conductive layer, and anisotropically etching the gate conductive layer using the gate capping pattern GP as an etch mask. A patterning process for forming the gate capping pattern GP may include the aforementioned EUV lithography process or multi patterning technique.

Through the anisotropic etching process, the word line WL vertically overlapping the gate capping pattern GP may be formed from the gate conductive layer. The gate insulating layer GI may remain on the sidewall of the active pillar ACP by the anisotropic etching process. The gate insulating layer GI may also remain on at least a portion of the bit line BL.

Referring to FIGS. 4 and 9A to 9C, a second interlayer insulating layer ILD2 filling spaces between word lines WL and spaces between active pillars ACP may be formed. A planarization process may be performed on the second interlayer insulating layer ILD2 until upper surfaces of the active pillars ACP are exposed.

The exposed active pillar ACP may be recessed to form a first recess RCS1 in an upper portion of the active pillar ACP. An upper surface of the active pillar ACP may be lower than a upper surface of the gate capping pattern GP and a upper surface of the second interlayer insulating layer ILD2, due to the first recess RCS1.

Referring to FIGS. 4 and 10A to 10C, landing pads LP may be formed on the active pillars ACP, respectively. A lower portion of the landing pad LP may fill the first recess RCS1. A diameter of an upper portion of the landing pad LP may be greater than a diameter of a lower portion of the landing pad LP. The landing pad LP may be formed to vertically overlap the active pillar ACP connected thereto.

In detail, forming the landing pads LP may include forming a metal layer filling the first recesses RCS1 on the second interlayer insulating layer ILD2 and patterning the metal layer. Second recesses RCS2 defining landing pads LP may be formed by the patterning process. A bottom surface of the second recess RCS2 may be lower than the upper surface of the second interlayer insulating layer ILD2. The landing pads LP may be spaced apart from each other by the second recess RCS2. The gate capping pattern GP may limit and/or prevent the second recess RCS2 from exposing the word line WL due to over-etching.

Referring back to FIGS. 4 and 5A to 5C, an insulating pattern INP filling the second recess RCS2 may be formed. An upper surface of the insulating pattern INP may be formed to be coplanar with an upper surface of the landing pad LP. Data storage patterns DSP may be formed on the landing pads LP, respectively.

In one embodiment of inventive concepts, forming the data storage pattern DSP may include forming a lower electrode extending in a third direction D3 on the landing pad LP, and forming a capacitor dielectric layer on the lower electrode, and forming an upper electrode on the capacitor dielectric layer.

Hereinafter, various embodiments of inventive concepts will be described. In embodiments of inventive concepts to be described later, detailed descriptions of technical features overlapping with those previously described with reference to FIGS. 4 and 5A to 5C will be omitted, and differences will be described in detail.

Figure 11:
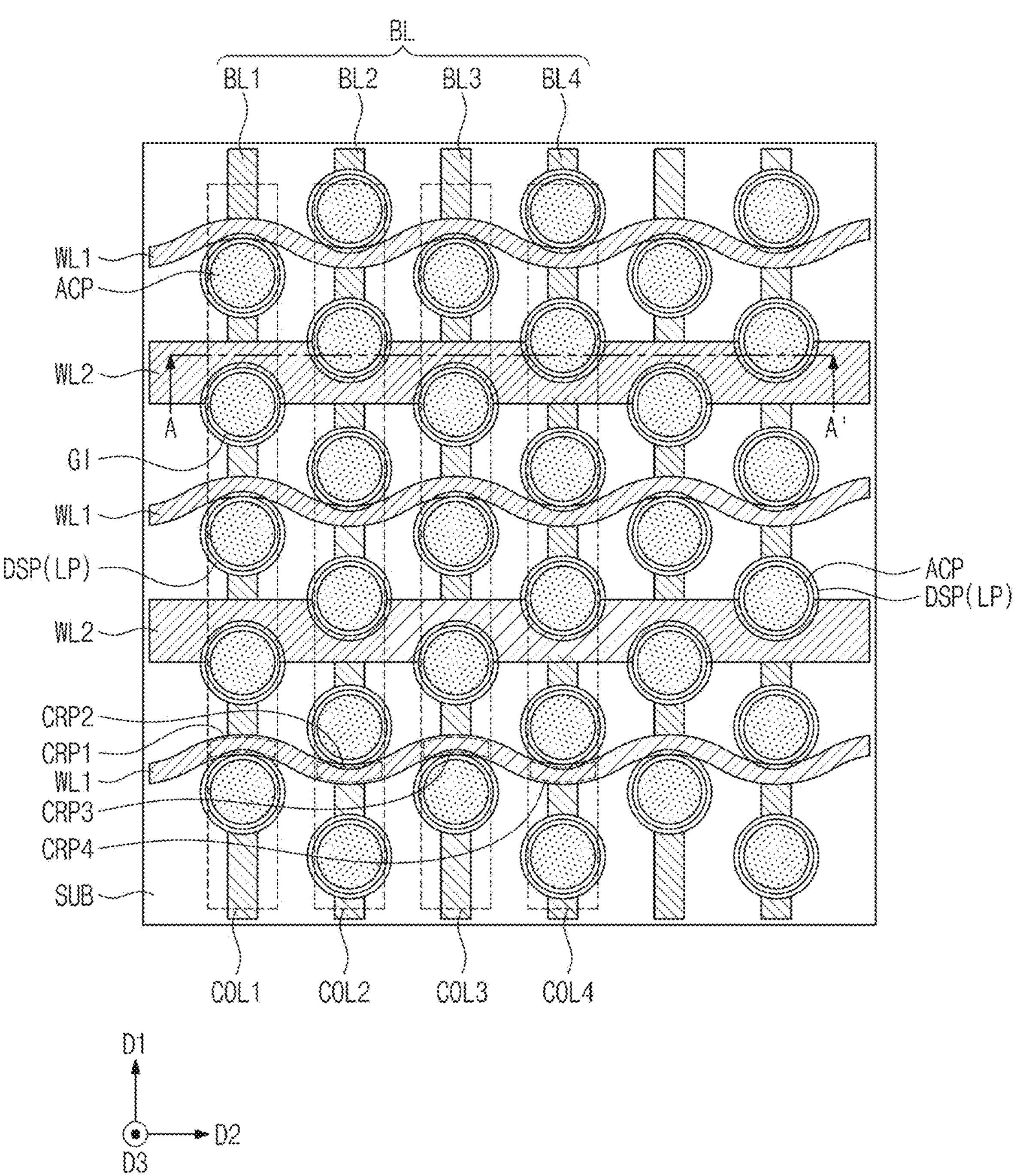
FIG. 11 is a plan view of a semiconductor memory device according to an embodiment of inventive concepts.
Figure 12:
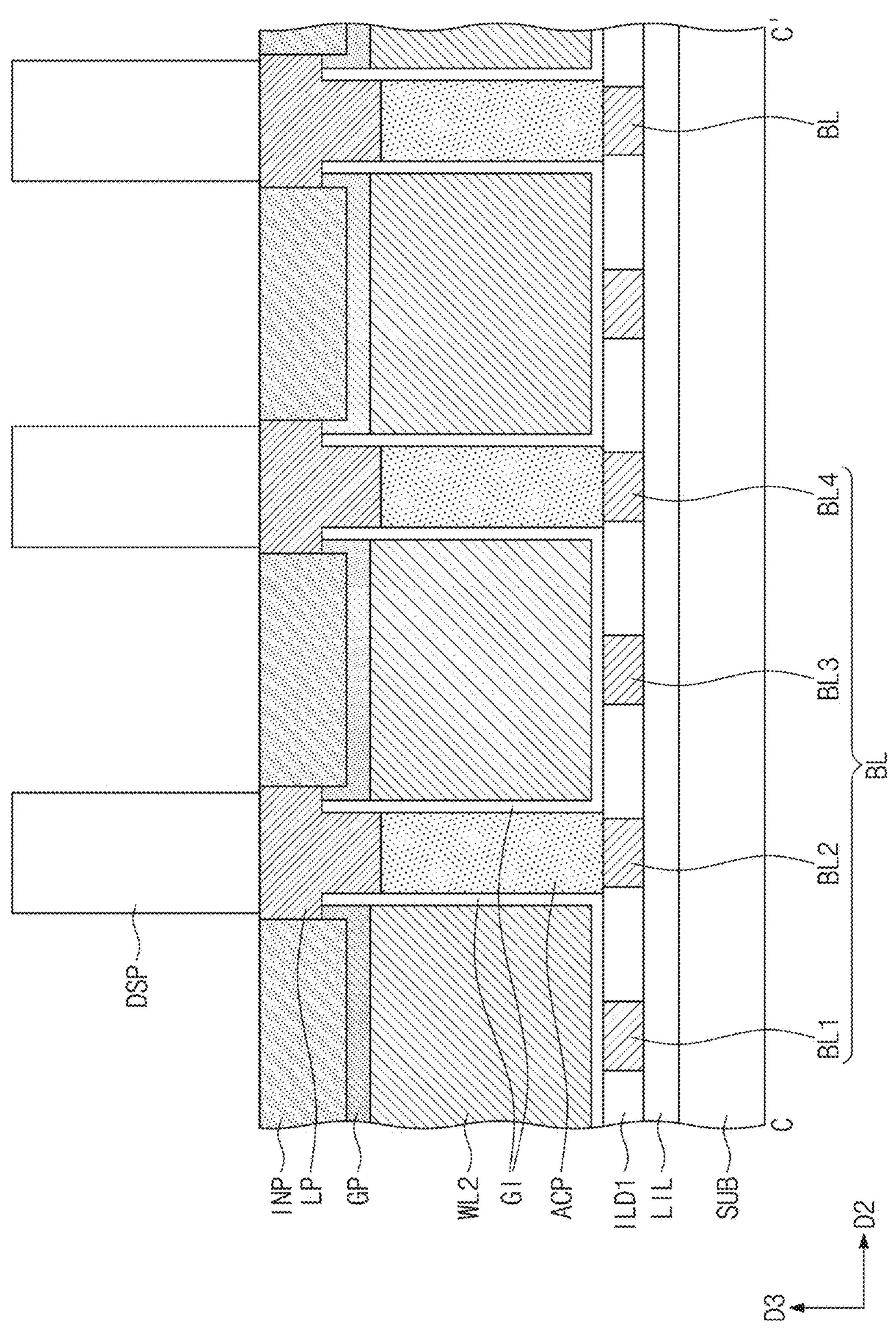
FIG. 12 is a cross-sectional view taken along line A-A' of FIG. 11.

FIG. 11 is a plan view of a semiconductor memory device according to another embodiment of inventive concepts. FIG. 12 is a cross-sectional view taken along line A-A' of FIG. 11.

Referring to FIGS. 11 and 12, word lines WL may include first word lines WL1 and second word lines WL2, which may be alternately disposed in a first direction D1. The first word line WL1 may be substantially the same as the wavy word line WL described above with reference to FIGS. 4 and 5A to 5C.

The second word line WL2 may have a different shape or line width than that of the first word line WL1. As an example, the second word line WL2 may have a line shape extending in a second direction D2. The line width of the second word line WL2 may be greater than that of the first word line WL1. The second word line WL2 may surround at least a portion of the active pillar ACP. The second word line WL2 may have a line width that is capable of covering the active pillars ACP arranged in a zigzag shape in the second direction D2.

The first word lines WL1 and the second word lines WL2 may be formed by different patterning processes. That is, the first word lines WL1 and the second word lines WL2 may be formed using a multi-patterning technique. In detail, the first word lines WL1 may be formed by a first photolithography process using a first photo mask, and the second word lines WL2 may be formed by a second photolithography process using a second photo mask.

Figure 13:
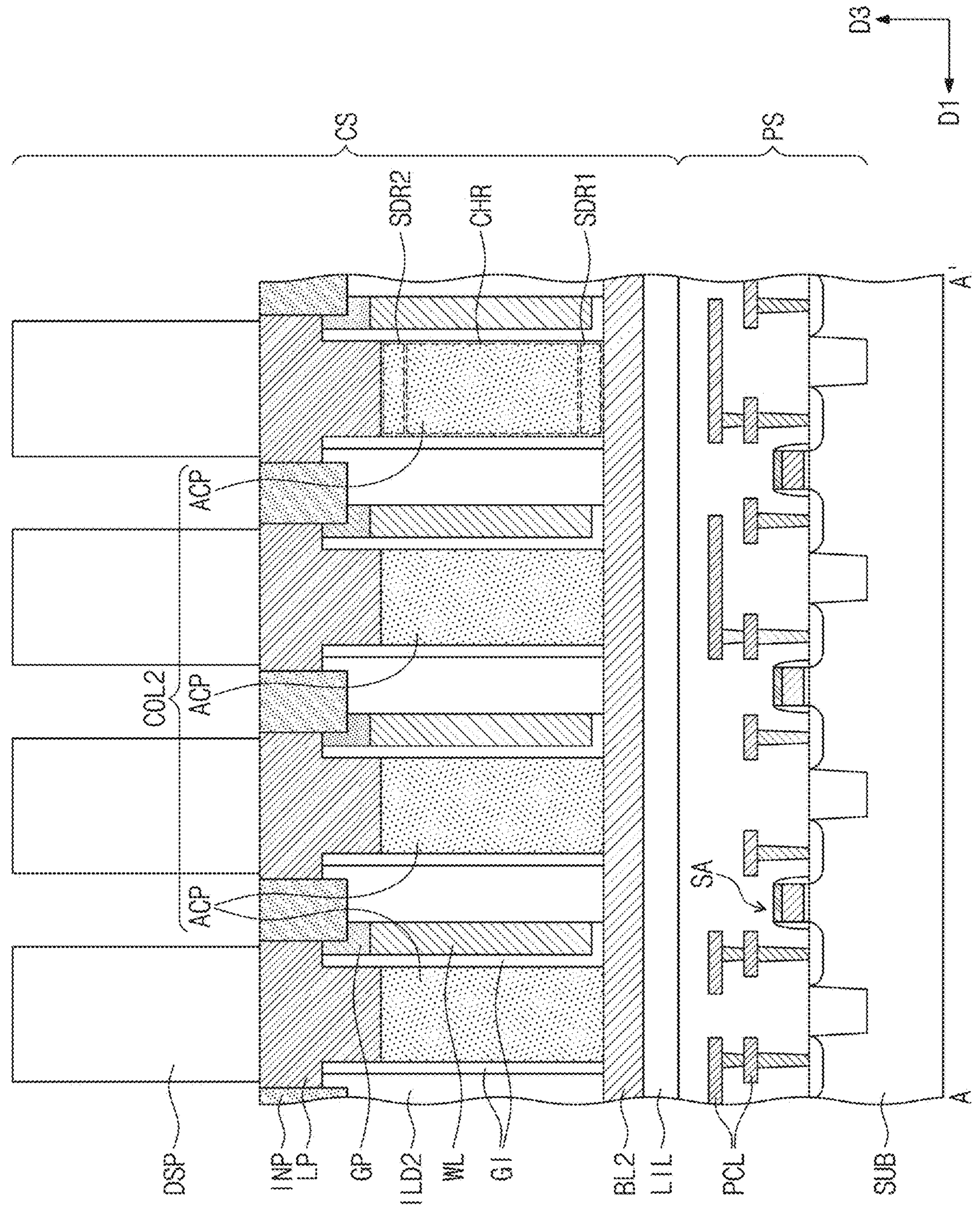
FIGS. 13 and 14 are cross-sectional views taken along line A-A' of FIG. 4 for explaining a semiconductor memory device according to another embodiment of inventive concepts.
Figure 14:
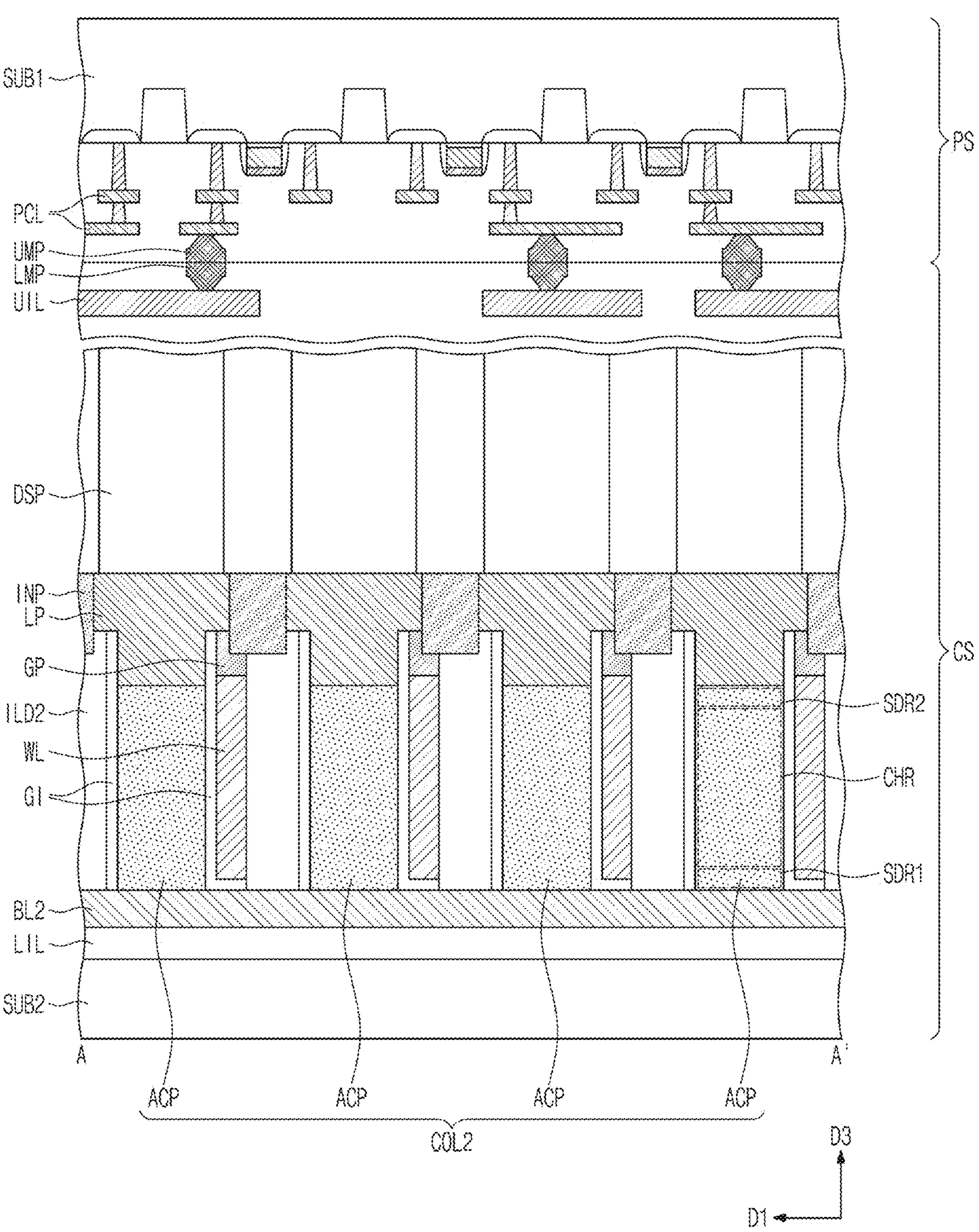

FIGS. 13 and 14 are cross-sectional views taken along line A-A' of FIG. 4 for explaining a semiconductor memory device according to another embodiment of inventive concepts.

Referring first to FIG. 13, a semiconductor memory device may include a peripheral circuit structure PS on a substrate SUB and a cell array structure CS on the peripheral circuit structure PS. The substrate SUB may be, for example, a single crystal silicon substrate.

The peripheral circuit structure PS may be disposed between the substrate SUB and a lower insulating layer LIL. The peripheral circuit structure PS may include a core and peripheral circuits SA provided on the substrate SUB, a peripheral circuit insulating layer covering the core and peripheral circuits SA, and peripheral metal structures PCL disposed in the peripheral circuit insulating layer.

The core and peripheral circuits SA may include the row and column decoders (2 and 4 in FIG. 1), the sense amplifier (3 in FIG. 1), and the control logic (5 in FIG. 1) described with reference to FIG. 1. For example, the core and peripheral circuits SA may include NMOS transistors and PMOS transistors on the substrate SUB. The peripheral metal structures PCL may include a plurality of metal patterns and metal plugs connecting the metal patterns.

The core and peripheral circuits SA may be electrically connected to bit lines BL through the peripheral metal structures PCL. That is, the sense amplifiers may be electrically connected to the bit lines BL, and each sense amplifier may amplify and output a difference in voltage levels sensed by a pair of bit lines BL.

As in the above-described embodiments, the cell array structure CS may include memory cells including vertical channel transistors (VCT). The bit lines BL of the cell array structure CS may be disposed adjacent to the peripheral circuit structure PS. The bit lines BL may be disposed adjacent to the peripheral circuit structure PS, and thus electrical connection paths between the bit lines BL and the core and peripheral circuits PTR may be reduced.

Referring to FIG. 14, a semiconductor memory device may include a cell array structure CS including first metal pads LMP on an uppermost portion thereof and a peripheral circuit structure PS including second metal pads UMP on a lowermost portion thereof. In this case, the first metal pads LMP of the cell array structure CS and the second metal pads UMP of the peripheral circuit structure PS may be electrically and physically connected to each other by a bonding manner. The first and second metal pads LMP and UMP may include a metal material, for example, copper (Cu).

The cell array structure CS may be provided on a second substrate SUB2. Upper interconnections UIL may be provided on the uppermost portion of the cell array structure CS. The upper interconnections UIL may be electrically connected to word lines WL and bit lines BL of the cell array structure CS. The first metal pads LBM may be provided on the upper interconnections UIL.

The peripheral circuit structure PS may include core and peripheral circuits SA provided on a first substrate SUB1, a peripheral circuit insulating layer covering the core and peripheral circuits SA, and peripheral metal structures PCL disposed in the peripheral circuit insulating layer. The second metal pads UMP may be connected to the peripheral metal structures PCL.

A semiconductor memory device according to embodiments of inventive concepts may manufactured by forming the cell array structure CS including memory cells on the second substrate SUB2, forming the peripheral circuit structure PS including the core and peripheral circuits on the first substrate SUB1, and then connecting the first substrate SUB1 and the second substrate SUB2 to each other by a bonding manner That is, the first metal pads LMP of the cell array structure CS and the second metal pads UMP of the peripheral circuit structure PS may be electrically and physically connected to each other by a bonding manner.

According to the semiconductor memory devices of embodiments of inventive concepts, the active pillars may be arranged in the honeycomb structure, and thus the number of cells provided within a unit area may be maximized. Accordingly, the integration of the semiconductor memory device may be improved. The word line of inventive concepts may have the wavy shape surrounding the active pillar. As a result, channel controllability of the gate electrode may be improved, and electrical characteristics of the device may be improved.

One or more of the elements disclosed above may include or be implemented in processing circuitry such as hardware including logic circuits; a hardware/software combination such as a processor executing software; or a combination thereof. For example, the processing circuitry may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While some embodiments are described above, a person skilled in the art may understand that many modifications and variations are made without departing from the spirit and scope of inventive concepts defined in the following claims. Accordingly, the example embodiments of inventive concepts should be considered in all respects as illustrative and not restrictive, with the spirit and scope of inventive concepts being indicated by the appended claims.

What is claimed is:

1. A semiconductor device comprising:

a substrate;

a plurality of bit lines extending in a first direction on the substrate;

a plurality of active pillars respectively on the plurality of bit lines, each of the plurality of active pillars having a length extending in a direction perpendicular to an upper surface of the substrate;

a word line extending in a second direction along the plurality of active pillars;

a plurality of landing pads respectively on the plurality of active pillars; and a plurality of data storage patterns respectively on the plurality of landing pads, wherein the word line has a wavy shape when viewed in a plan view, wherein a group of the plurality of active pillars are spaced apart from each other in the first direction on a same one of the plurality of bit lines, and the same one of the plurality of bit lines is continuous underneath the group of the plurality of active pillars, and wherein the plurality of bit lines, the plurality of active pillars, and the plurality of data storage patterns are arranged such that one of the plurality of bit lines, one of the plurality of active pillars, and one of the plurality of data storage patterns that correspond to each other overlap each other in a vertical direction.

2. The semiconductor device of claim 1, wherein the plurality of active pillars are arranged in a zigzag shape along the second direction.

3. The semiconductor device of claim 1, wherein the plurality of active pillars include a first active pillar, a second active pillar, a third active pillar, and a fourth active pillar sequentially arranged in the second direction, the word line includes a first curved portion adjacent to the first active pillar, a second curved portion adjacent to the second active pillar, a third curved portion adjacent to the third active pillar, and a fourth curved portion adjacent to the fourth active pillar, the first curved portion and the third curved portion protrude toward the first direction, and the second curved portion and the fourth curved portion protrude in a direction opposite to the first direction.

4. The semiconductor device of claim 1, wherein each of the plurality of landing pads is vertically aligned with a corresponding one of the plurality of active pillars.

5. The semiconductor device of claim 1, wherein the plurality of active pillars include at least one amorphous oxide semiconductor, and the at least one amorphous oxide semiconductor includes at least one of InGaZnO, InGaSiO, InSnZnO, InZnO, ZnO, ZnSnO, ZnON, ZrZnSnO, SnO, HfInZnO, GaZnSnO, AlZnSnO, YbGaZnO, and InGaO.

6. The semiconductor device of claim 1, further comprising:

a peripheral circuit structure on the substrate, wherein the peripheral circuit structure includes peripheral circuits, and the peripheral circuit structure is below the plurality of bit lines.

7. The semiconductor device of claim 1, wherein each of the plurality of data storage patterns includes a capacitor.

8. The semiconductor device of claim 1, wherein the word line includes first word lines and second word lines alternately arranged in the first direction, and a line width of each of the first word lines is different from a line width of each of the second word lines.

9. The semiconductor device of claim 8, wherein each of the first word lines has the wavy shape, and each of the second word lines has a line shape.

10. The semiconductor device of claim 1, wherein six active pillars adjacent to each other among the plurality of active pillars define a hexagon.

11. A semiconductor device comprising:

a substrate;

a plurality of bit lines extending in a first direction on the substrate;

a plurality of active pillars on the plurality of bit lines, each of the plurality of active pillars having a length extending in a direction perpendicular to an upper surface of the substrate;

a plurality of word lines extending in a second direction crossing the first direction, each of the plurality of word lines extending along the plurality of active pillars that are arranged in the second direction;

a plurality of landing pads respectively on the plurality of active pillars; and a plurality of data storage patterns respectively on the plurality of landing pads, wherein the plurality of bit lines include a first bit line, a second bit line, a third bit line, and a fourth bit line sequentially arranged in the second direction, the plurality of active pillars include a first column including first active pillars on the first bit line, a second column including second active pillars on the second bit line, and a third column including third active pillars on the third bit line, and a fourth column including fourth active pillars on the fourth bit line, wherein the first column and the second column are offset in the first direction, wherein the third column and the fourth column are offset in the first direction, wherein the first column and the third column are aligned with each other, and wherein the second column and the fourth column are aligned with each other, wherein the plurality of word lines each have a wavy shape in plan view, the first active pillars in the first column are spaced apart from each other in the first direction on the first bit line, and the first bit line is continuous underneath the first active pillars in the first column, and wherein the plurality of bit lines, the plurality of active pillars, and the plurality of data storage patterns are arranged such that one of the plurality of bit lines, one of the plurality of active pillars, and one of the plurality of data storage patterns that correspond to each other overlap each other in a vertical direction.

12. The semiconductor device of claim 11, wherein the plurality of active pillars are arranged in a zigzag shape along the second direction, and the plurality of word lines extend along the plurality of active pillars arranged in the zigzag shape.

13. The semiconductor device of claim 11, wherein the plurality of active pillars are arranged in a honeycomb structure, and the plurality of landing pads are arranged in the honeycomb structure.

14. The semiconductor device of claim 11, wherein the plurality of active pillars are arranged in a honeycomb structure, and the plurality of data storage patterns are arranged in the honeycomb structure.

15. The semiconductor device of claim 11, wherein the plurality of word lines include first word lines and second word lines alternately arranged in the first direction, and a line width of each of the first word lines is different from a line width of each of the second word lines.

* * * * *